US006877946B2

(12) United States Patent
Kinnard et al.

(10) Patent No.: US 6,877,946 B2
(45) Date of Patent: Apr. 12, 2005

(54) WAFER TRANSPORT APPARATUS

(75) Inventors: David William Kinnard, Olney, MD (US); Daniel Richardson, Westminster, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/663,088

(22) Filed: Sep. 16, 2003

(65) Prior Publication Data

US 2004/0052632 A1 Mar. 18, 2004

Related U.S. Application Data

(62) Division of application No. 09/905,031, filed on Jul. 13, 2001, now Pat. No. 6,663,333.

(51) Int. Cl.[7] .................................................. B65G 49/07

(52) U.S. Cl. .................... 414/805; 414/217; 414/744.3; 414/939

(58) Field of Search .............................. 414/217, 744.3, 414/744.5, 805, 939; 901/19, 23–25

(56) References Cited

U.S. PATENT DOCUMENTS

| | | | | |
|---|---|---|---|---|
| 4,483,654 A | | 11/1984 | Koch et al. | |
| 4,584,045 A | | 4/1986 | Richards | |
| 4,728,252 A | | 3/1988 | Lada et al. | |
| 4,749,330 A | | 6/1988 | Hine | |
| 5,083,896 A | | 1/1992 | Uehara et al. | |
| 5,223,112 A | | 6/1993 | Tepman | |
| 5,851,296 A | * | 12/1998 | Haraguchi et al. | 118/719 |
| 5,883,017 A | | 3/1999 | Tepman et al. | |
| 5,902,088 A | | 5/1999 | Fairbairn et al. | |
| 5,997,235 A | | 12/1999 | Hofmeister | |
| 6,235,656 B1 | | 5/2001 | Clarke | |
| 6,250,869 B1 | | 6/2001 | Kroeker | |
| 6,350,097 B1 | | 2/2002 | Mitchell et al. | |
| 6,450,757 B1 | | 9/2002 | Saeki et al. | |
| 6,464,448 B1 | | 10/2002 | Ha | |

OTHER PUBLICATIONS

Patent Abstract for 1–64232.

* cited by examiner

*Primary Examiner*—James W. Keenan
(74) *Attorney, Agent, or Firm*—Cantor Colburn LLP

(57) ABSTRACT

A loadlock chamber assembly includes a loadlock chamber, a sub-chamber removably attached to the loadlock chamber and a first robot arm having a primary pivot axis within the sub-chamber, wherein the first robot arm can move a substrate from a position approximately in a center of the loadlock chamber to a position outside the loadlock chamber.

16 Claims, 31 Drawing Sheets

WAFER TRANSPORT APPARATUS

CROSS REFERENCE TO RELATED APPLICATIONS

This application is a division of U.S. application Ser. No. 09/905,031 filed Jul. 13, 2001 now U.S. Pat. No. 6,663,333.

FIELD OF THE INVENTION

The present invention relates to vacuum transport devices, and more particularly, to a process and apparatus for transporting substrates between two regions having different pressures without substantially affecting the pressure of either region.

BACKGROUND OF THE INVENTION

Semiconductor etching, cleaning, and deposition processes typically employ a plasma mediated process that is desirably carried out at a reduced pressure, e.g., in an evacuated (vacuum) chamber. It is important to maintain the pressure within the chamber within a specific predetermined range in order to avoid costly delays in the semiconductor wafer production process and to minimize undesirable variations in the quality of the semiconductor wafer products that are produced. Maintaining pressure within the predetermined range is difficult since, during device fabrication, substrates are sequentially fed into the processing chamber in a continuous or batch process from an external source operating at atmospheric conditions. Time spent controlling and readjusting the chamber pressure for each substrate or substrate batch introduced into the processing chamber can greatly increase processing times. The decreased throughput resulting from controlling and readjusting the pressure increases overall device costs.

Chamber overhead time is defined as the time required for any operation involving the process chamber that does not include actual wafer processing time. The process chamber overhead time typically includes the time period for reducing the pressure within the process chamber to the desired processing pressure after each wafer exchange, heating the wafer to the desired temperature, venting the process chamber to allow wafer exchange and the wafer exchange itself. Minimizing overhead time increases productivity and reduces overall device costs.

Numerous apparatuses and methods exist for transferring semiconductor wafers into or out of a process chamber for continuous treatment without disturbing or otherwise affecting chamber pressure. Many such devices teach the use of an airlock chamber, i.e., a loadlock chamber, in operative communication with the processing chamber. Such a loadlock chamber can be adjusted to match the operating pressure in the processing chamber, thereby allowing transfer of substrates into or out of the process chamber while also allowing the process chamber to maintain a relatively constant pressure. In these devices, robots are generally implemented as a single arm whose travel moves a wafer in a substantially linear manner. The arm translation path is configured such that a central axis of the wafer passes over or near a central robotic arm pivot. Such pivots are typically mounted in the center of the loadlock chamber due to physical size limitations imposed by robotic link arm design and associated link arm travel. As a result, these types of transfer mechanisms suffer from excessive internal chamber volume in the loadlock chamber assembly due to the required translating arm paths of the transfer mechanism. Moreover, since the primary or first pivot of the link arm is centrally located within the loadlock chamber, repair and access to the apparatus is difficult. Also, the prior art often uses a complex system of a timing belt and pulley arrangement coupled to a step motor drive output shaft, and a sleeve coupled to a first link arm axis, in order to effect rotation of the arms.

For example, U.S. Pat. No. 4,584,045 to Richards, discloses the use of a belt drive in a wafer positioning transport apparatus. A problem exists through the use of a spring in one of the arms of the transfer mechanism. As the belt wears or stretches, the spring extends the arm to keep the belt tight. This alters placement of the semiconductor wafer in the chamber. Wafer positioning devices necessarily must be very accurate in the positioning at all stages of operation of the device. Such wear, which alters placement, is undesirable.

In U.S. Pat. No. 4,728,252 to Lada, a complex wafer transport mechanism is disclosed. The device of this patent has one shaft sealed within another shaft, which rotates independently of the outer shaft. A complex seal mechanism inherently exposes the device to potential failure and fretting. Also, the device employs belts and requires two motors and two motor control circuits, with the attendant wire harness and the like. The complexity of this device makes it expensive. Moreover, the use of belts increases the potential for fretting or wear, producing contaminants. In addition, as the belts wear or stretch, they need to be replaced on a regular basis, both in order to maintain the accuracy of the operation of the device, as well as to keep the number of contaminating particulates down within the apparatus. Replacement of belts produces additional maintenance costs and undesirable down time for the system.

SUMMARY OF THE INVENTION

A wafer transport apparatus and process for transporting substrates between two regions having different pressures without substantially affecting the pressure of either region includes a loadlock chamber assembly coupled to a process chamber. The loadlock chamber assembly includes a loadlock chamber and a sub-chamber in communication with the load lock chamber. The loadlock chamber is coupled to the process chamber and includes a closable port there between The sub-chamber comprises a first robot arm having a primary pivot axis within the sub-chamber, wherein the first robot arm can move a substrate from a position approximately in a center of the loadlock chamber to a position outside the loadlock chamber. The first robot arm includes a first end effector for holding the substrate during transport between regions.

The first robot arm is mounted onto a rotatable shaft sleeve and comprises a first link arm including an elongated housing having a first end and a second end, wherein the first link arm comprises a first cam disposed within the housing and a first four bar link mechanism driven by the first cam. The first cam is fixedly coupled to a shaft mounted coaxially within the shaft sleeve, wherein the shaft defines the primary pivot axis of the robot arm. The first robot arm further includes a first translating arm pivotably connected to the second end of the first link arm and having a first end effector attached to an end of the translating arm, wherein rotation of the first link arm about the shaft engages the first four bar link mechanism with the first cam and pivotably moves the first translating arm about a secondary pivot axis. The link arm and the translating arm fit entirely within the sub-chamber.

The first four bar link mechanism includes a first cam follower coupled to the first cam, a first driver link coupled to the first cam follower, and a first rocker link coupled to both the first driver link and the first link arm. The first rocker link comprises a rocker arm and a spring, wherein the spring is coupled to the housing of the first link arm and the rocker arm, and wherein the rocker arm is adjustably coupled to the driver link.

In a preferred embodiment, the loadlock chamber assembly includes a second robot arm pivotable about the primary pivot axis. The first and second robot arms can pivot independently of each other and are capable of placing one substrate into the process chamber while simultaneously removing another substrate from the process chamber. The first and second robot arms fit entirely within the sub-chamber.

The loadlock chamber assembly further includes a first motor for moving the first and second arms vertically along the primary pivot axis, a second motor for pivoting the first robot arm about the primary pivot axis, and a third motor for pivoting the second robot arm about the primary pivot axis.

The process for transporting substrates between two regions having different pressures without substantially affecting the pressure of either region includes housing a first and second robot arm in the removable sub-chamber coupled to the loadlock chamber. The first and second arms include a primary pivot axis within the sub-chamber. An active wafer is processed in the process chamber at a predetermined operating pressure, wherein the process chamber is coupled to the loadlock chamber and includes a closable port. The active wafer is removed from the process chamber with the first robot arm and a first queued wafer is deposited into the process chamber with the second robot arm at the operating pressure of the process chamber. The port is closed and the first queued wafer is processed in the process chamber at the operating pressure while the loadlock chamber is simultaneously vented for receiving a second queued wafer from outside the loadlock chamber. The pressure in the loadlock chamber is then reduced to the operating pressure and the port opened. The first queued wafer (now processed) is removed from the process chamber with the first robot arm and the second queued wafer is deposited into the process chamber with the second arm.

It is to be understood that both the foregoing general description and the following detailed description are exemplary and explanatory and are intended to provide further explanation of the invention as claimed

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1(*a, b*) and 2 show perspective views of a wafer transport apparatus including a loadlock chamber and a process chamber.

FIGS. 14–28 stepwise show a perspective view of a process for transporting wafers from the loadlock chamber assembly into and out of the process chamber.

DETAILED DESCRIPTION OF THE PREFERRED EMBODIMENTS

An apparatus and method for exchanging wafers under vacuum into and out of a process chamber is described. The apparatus generally includes a loadlock chamber in operative communication with a process chamber. Operative communication between the loadlock chamber and the process chamber permits wafer exchange between the chambers to occur without elevating the pressure within the process chamber. While active wafers are processed in the evacuated process chamber, e.g., plasma mediated processing, the loadlock chamber is vented to the atmosphere to allow additional wafers to be queued and loaded into the loadlock chamber. Once the queued wafers are loaded into the loadlock chamber, the loadlock chamber pressure is reduced to the operating pressure of the processing chamber. After processing of the active wafers in the process chamber is complete, the active wafers are then removed and exchanged with the queued wafers in the loadlock chamber. The queued wafers are then processed accordingly in the processing chamber and the previously processed active wafers removed from the loadlock chamber and exchanged with additional wafers to be processed. The cycle may then be repeated as necessary.

Advantageously, improved throughput is achieved since the operating pressure of the process chamber is continuously maintained. For example, photo-resist stripping processes, post etch residue removal and isotropic etching processes typically require the process chamber to be evacuated to a pressure range of about 1 torr to about 10 torr. Constantly maintaining the operating pressure in the process chamber improves tool productivity and process consistency. Pumping and venting steps for the processing chamber are no longer required as wafers are transferred into and out of the process chamber from the loadlock chamber within the predefined pressure range, thereby increasing wafer throughput. In this manner, the loadlock chamber dually functions as both a transfer chamber and a loadlock chamber.

Reference will now be made in detail to the preferred embodiments of the present invention, examples of which are illustrated in the accompanying drawings.

Figure 1A:
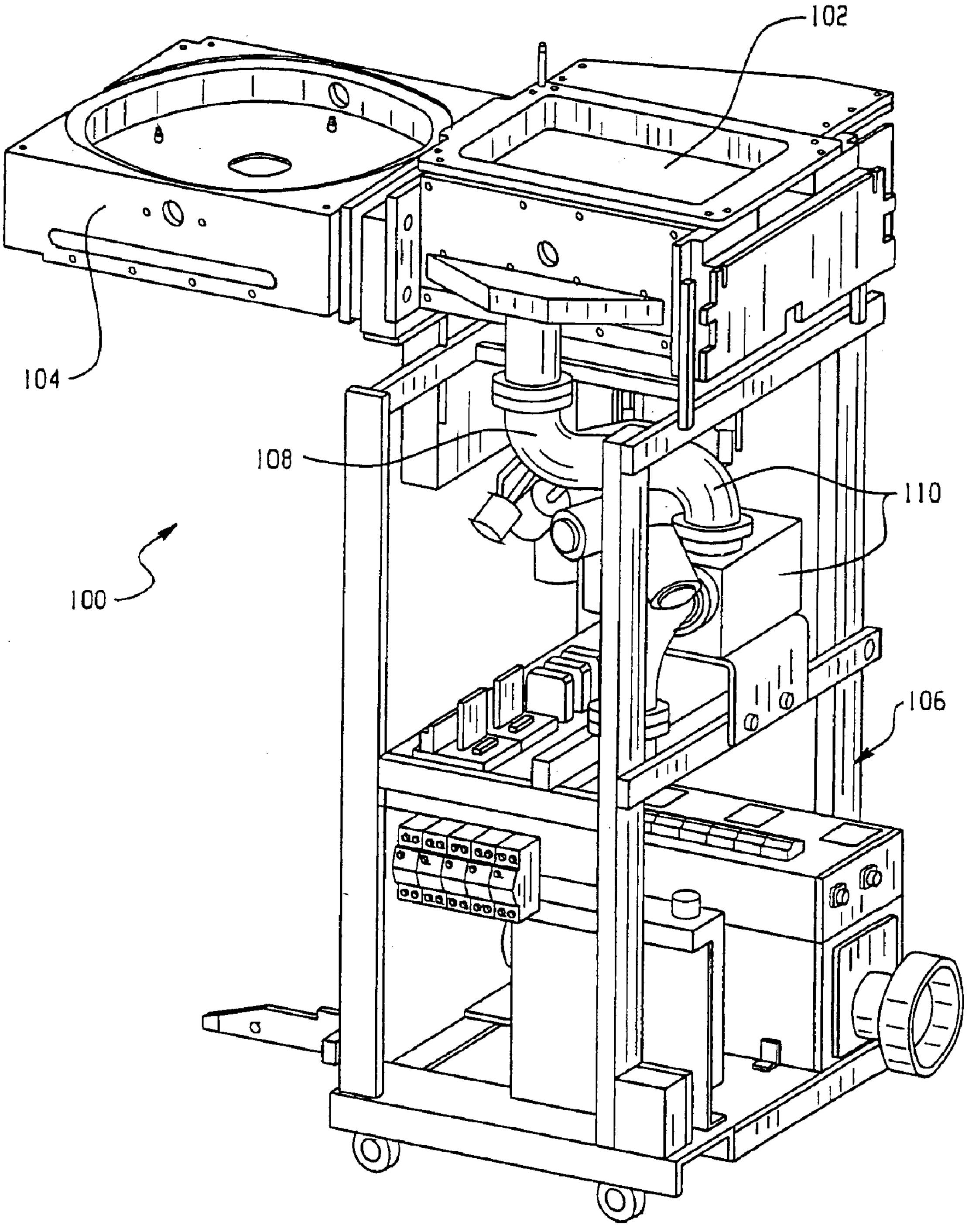
Figure 1B:
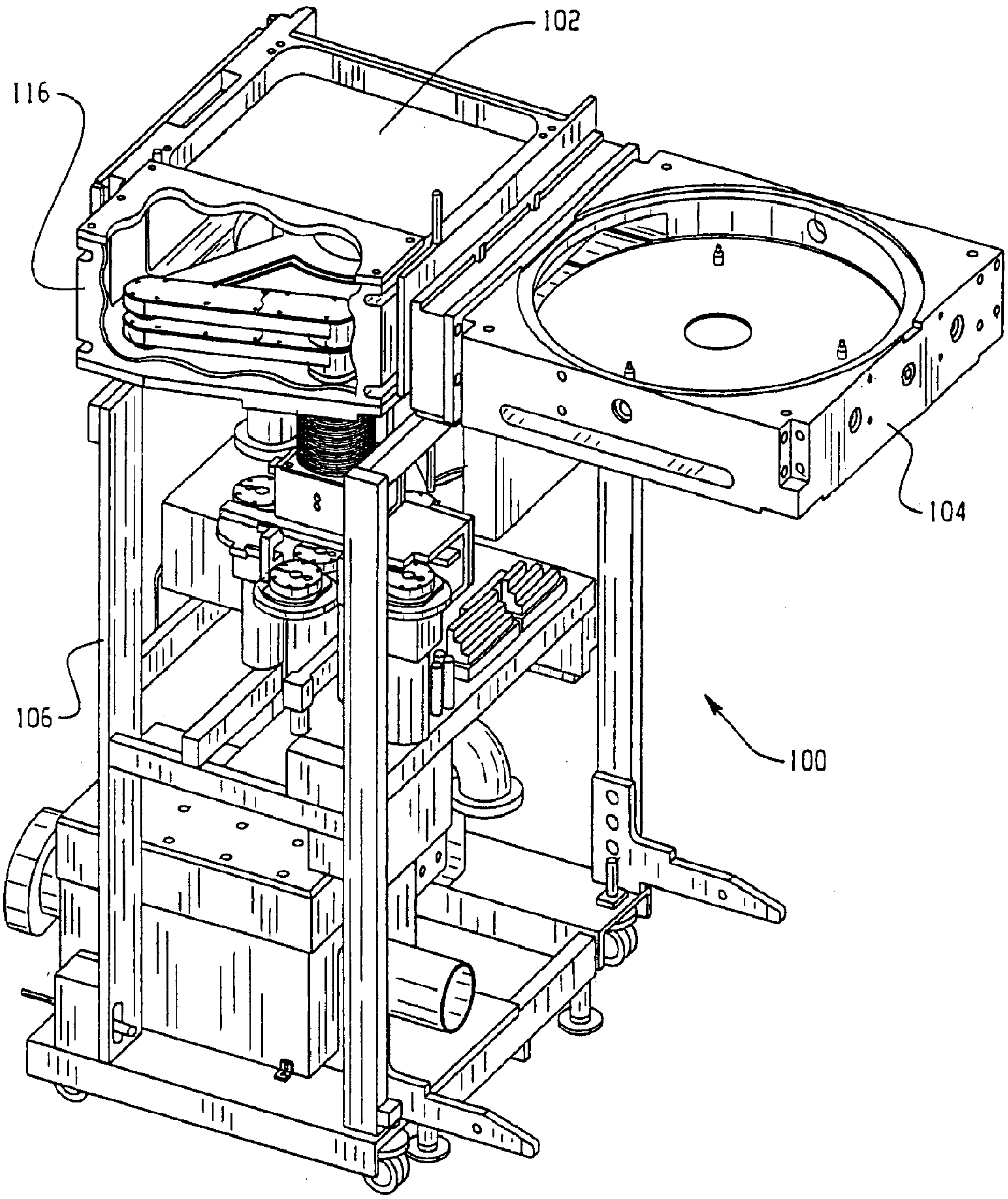
Figure 2:
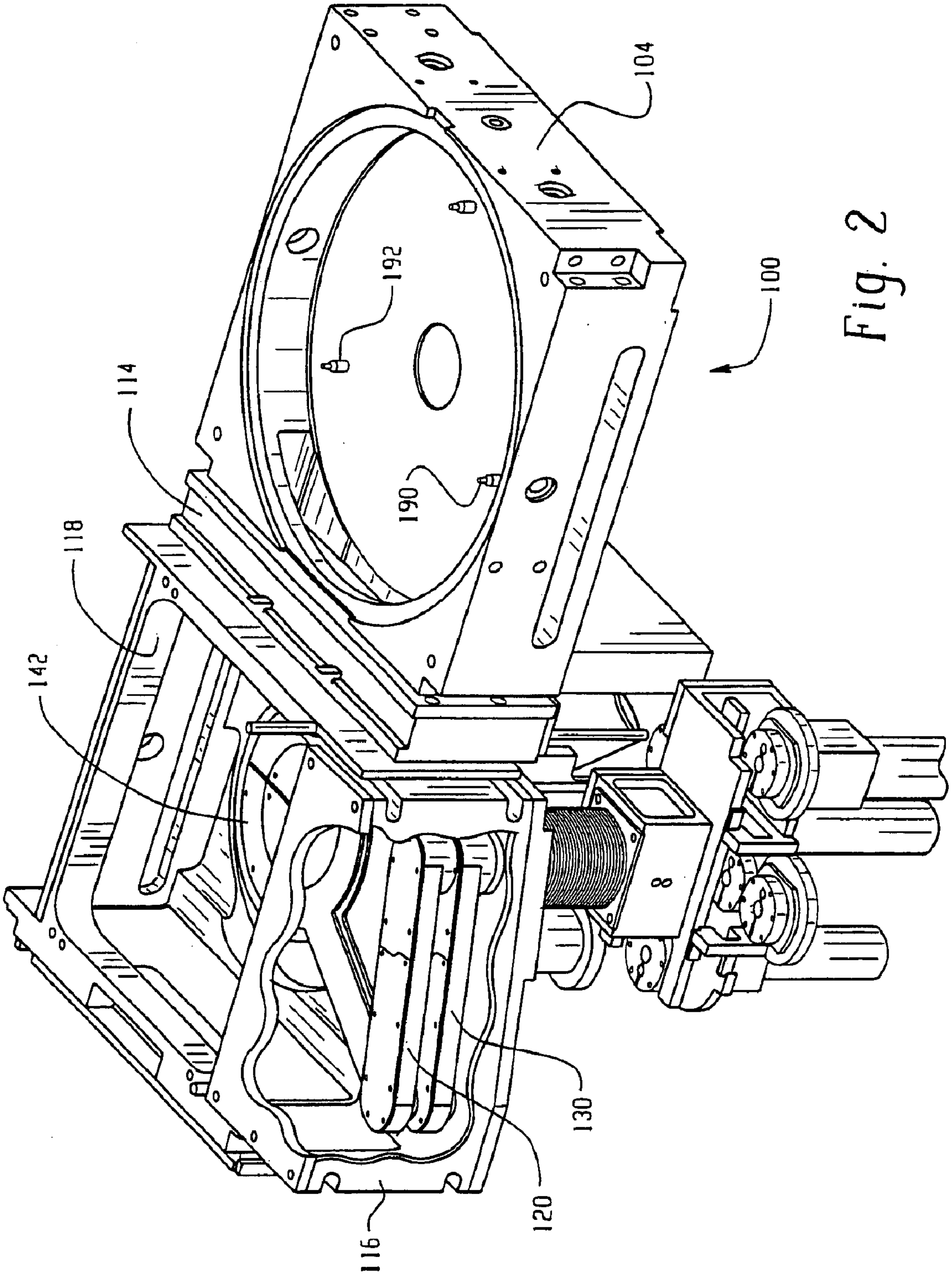

FIGS. 1 and 2 show perspective views of an apparatus, generally designated by reference numeral 100, that includes a loadlock chamber assembly 102 and a process chamber 104. The apparatus 100 is not intended to be limited to the particular configuration as shown. Other variations and configurations will be apparent to those skilled in the art in view of this disclosure. As may be seen from these figures, the apparatus 100 is mounted onto a movable cart 106 that includes an exhaust system 108, and a vacuum pump system 110 in communication with the loadlock chamber assembly 102.

Figure 3:
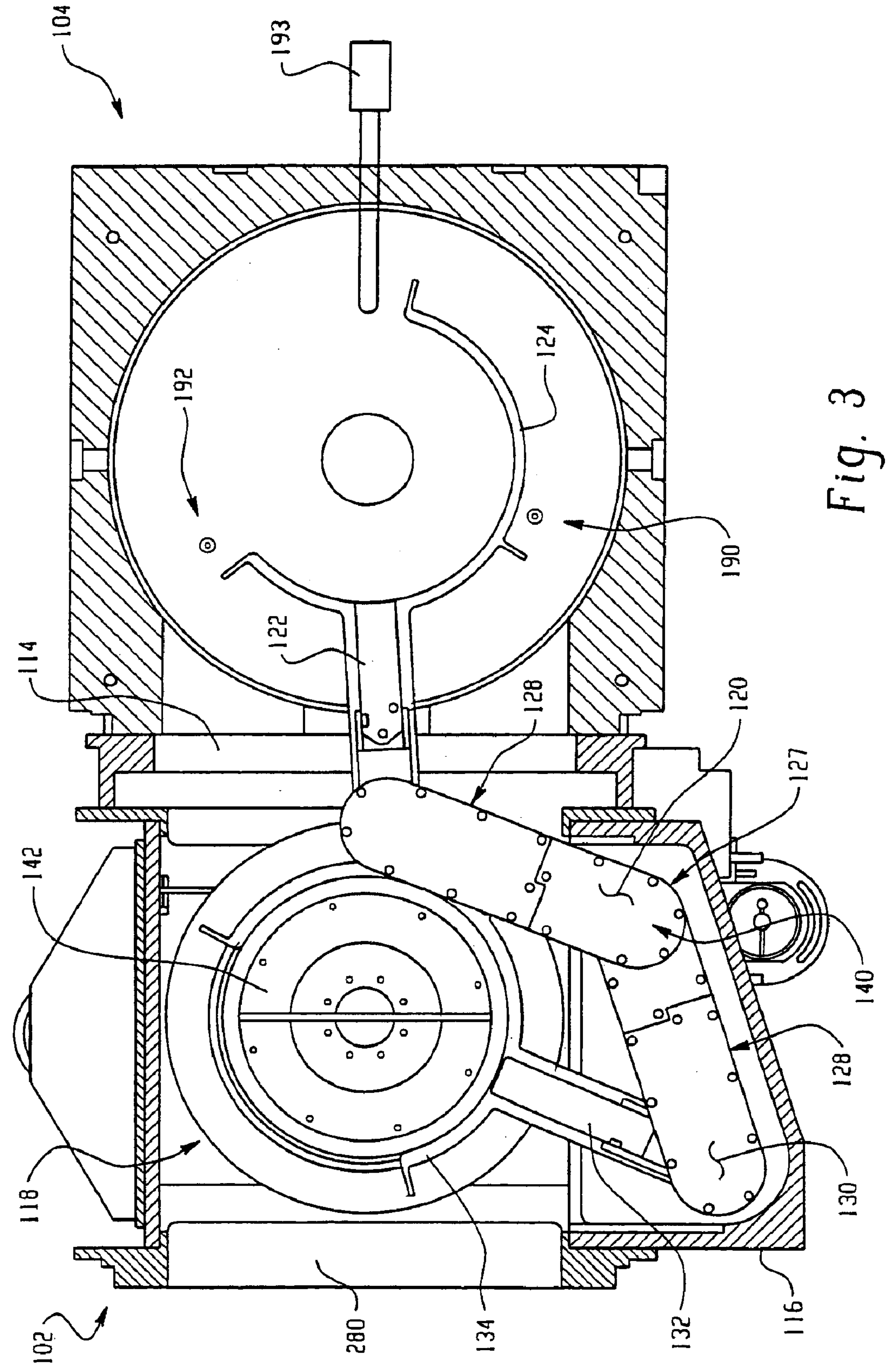
FIG. 3 shows a top plan view of the loadlock chamber and the process chamber.

FIG. 3 illustrates a top plan view of the loadlock chamber assembly 102 and the process chamber 104. The loadlock chamber assembly 102 and the process chamber 104 are interconnected, wherein a closable vacuum sealed opening 114 is disposed and configured for permitting the exchange of wafers between the two chambers. The opening 114, as shown, is configured for permitting a single wafer to be passed therethrough. Alternatively, opening 114 may be sized and configured to allow two wafers to simultaneously pass through, e.g., a processed wafer exiting the process chamber and an unprocessed wafer entering the process chamber. The loadlock chamber assembly 102 generally includes a removable sub-chamber 116 and a chamber 118. The sub-chamber 116 is removably attached to a wall of the chamber 118 and contains a dual end effector wafer transport mechanism. As will be described in further detail below, the dual end effector wafer transport mechanism robotically transports wafers into and out of the chambers 118 and 104 through the opening 114. Since the articulating arms are housed in a removable sub-chamber 116 affixed to the loadlock chamber 118, the setup and repair of the robotic arms is simplified.

The dual end effector wafer transport mechanism includes an upper link arm 120 and a lower link arm 130 that share a common pivot axis 140 about which the arms articulate. The distal end of the upper link arm 120 is pivotably connected to an upper translating arm 122 including an upper end effector 124 for holding a wafer or a substrate (not shown). Similarly constructed, the distal end of the lower link arm 130 is pivotably connected to a lower translating arm 132 including a lower end effector 134. The use of dual end effectors 124 and 134 permits the loadlock chamber 102 to simultaneously contain two wafers at a midway point in the wafer exchange operation with the process chamber 104, thereby allowing high throughput. A chuck 142 is mounted approximately in the center of the chamber 118, and may be manually adjusted in the x-y plane, if necessary. In a preferred embodiment, the chuck 142 functions as a cold plate.

Figure 4:
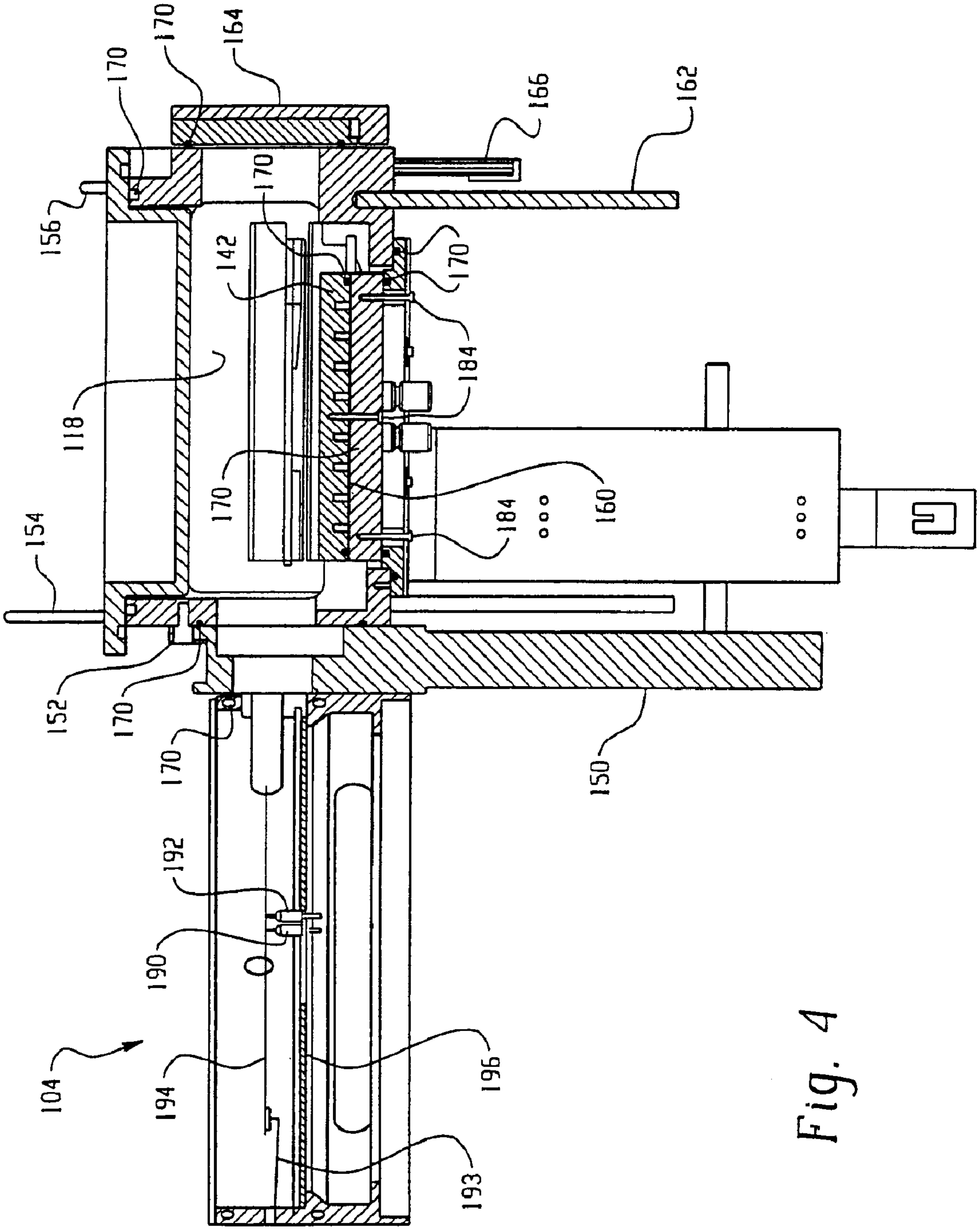
FIG. 4 shows a side cross sectional view of the loadlock chamber and the process chamber.

Referring now to FIG. 4, the process chamber 104 is separated from the loadlock chamber assembly 102 by a gate valve 150. The process chamber 104 includes two wafer support pins (wafer pins) 190 and 192 for supporting a wafer 194 during processing. A thermocouple 193 provides additional support for the wafer and provides a means for measuring the temperature of the wafer. The loadlock chamber assembly 102 includes a clamp 152, a long alignment pin 154, a short alignment pin 156, and an optional cold plate assembly 160 that includes the cold plate chuck 142 mounted thereon. Additionally, the loadlock chamber assembly 102 includes a chamber leg 162, a door assembly 164, and a door mount 166. O-rings 170 are disposed within the structure to seal the loadlock chamber 118. As may by further seen from this cross-sectional view, the cold plate 142 is adjustable in a horizontal (x-y) direction using screws 184. The x-y plane adjustment mechanism to the cold plate may include additional screws not shown in this figure for finer adjustment control.

Figure 5:
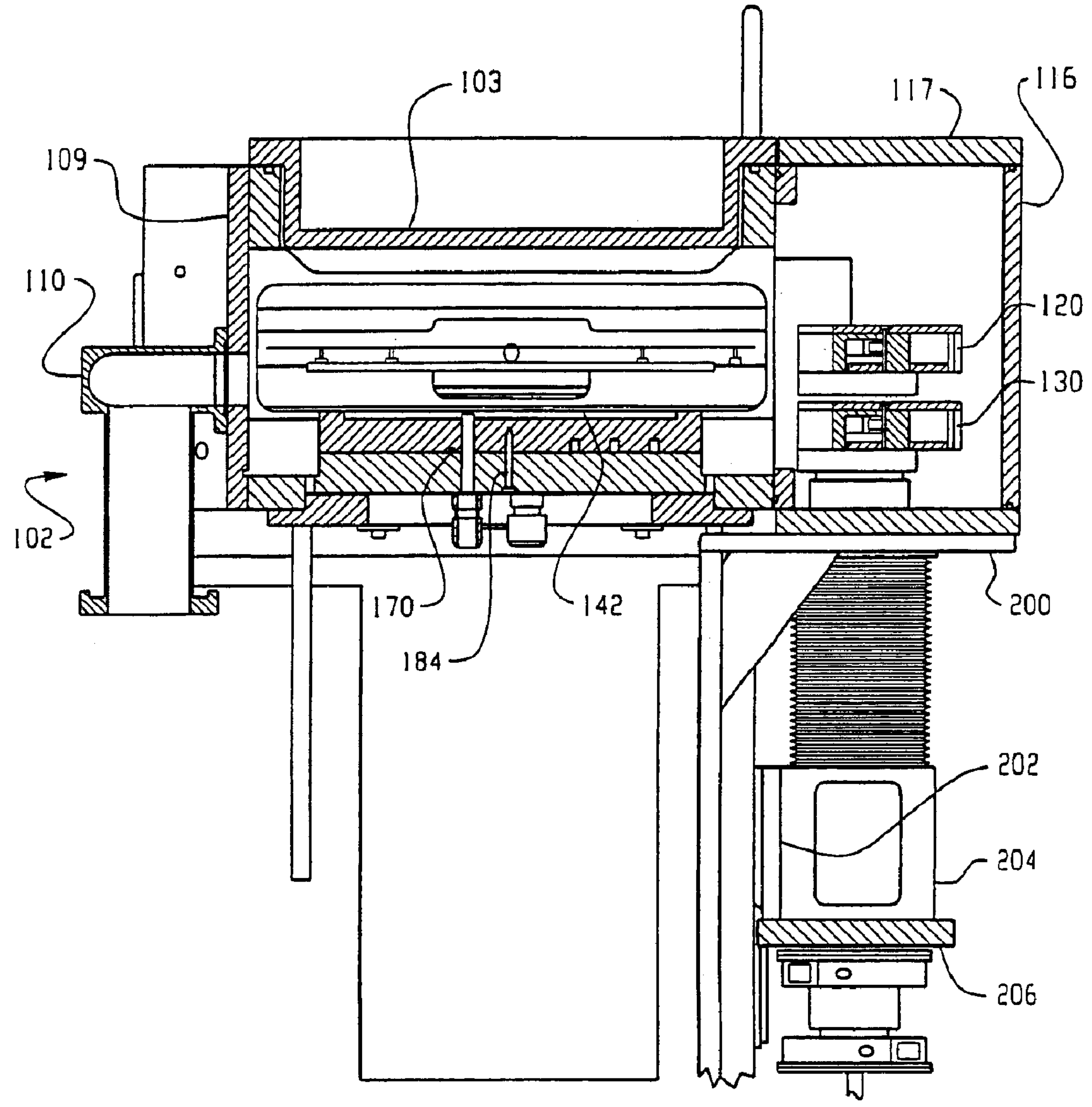
FIG. 5 shows an end cross sectional view of the loadlock chamber and the process chamber.

FIG. 5 is a side cross-sectional view of the loadlock chamber 102. The loadlock chamber 102 includes a removable cover 103, mounted thereon. The sub-chamber 116 also includes a removable cover 117 affixed to it. In this view, the upper robot arm 120 and the lower robot arm 130 may be seen with their cross-sections at the right of the figure. The view also shows some of the components of the motor assembly for actuating the dual end effector wafer transport mechanism, which includes a robot platform 200, a robot adapter plate 202, a linear shaft assembly 204, a linear slide 208, and a motor drive assembly 206.

Figure 6A:
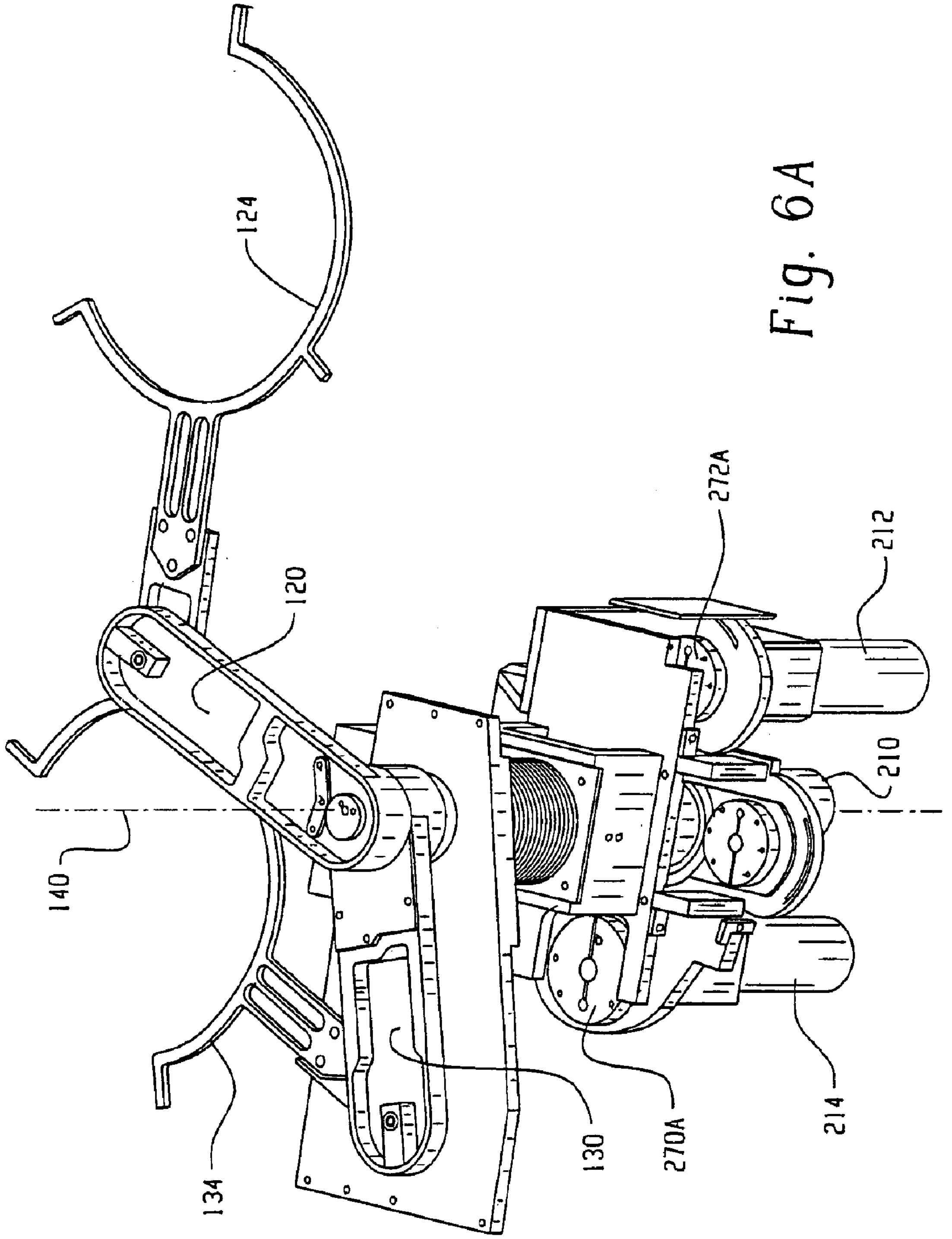
FIGS. 6(*a, b*) shows a perspective view and top plan view of the wafer transport mechanism.
Figure 6B:
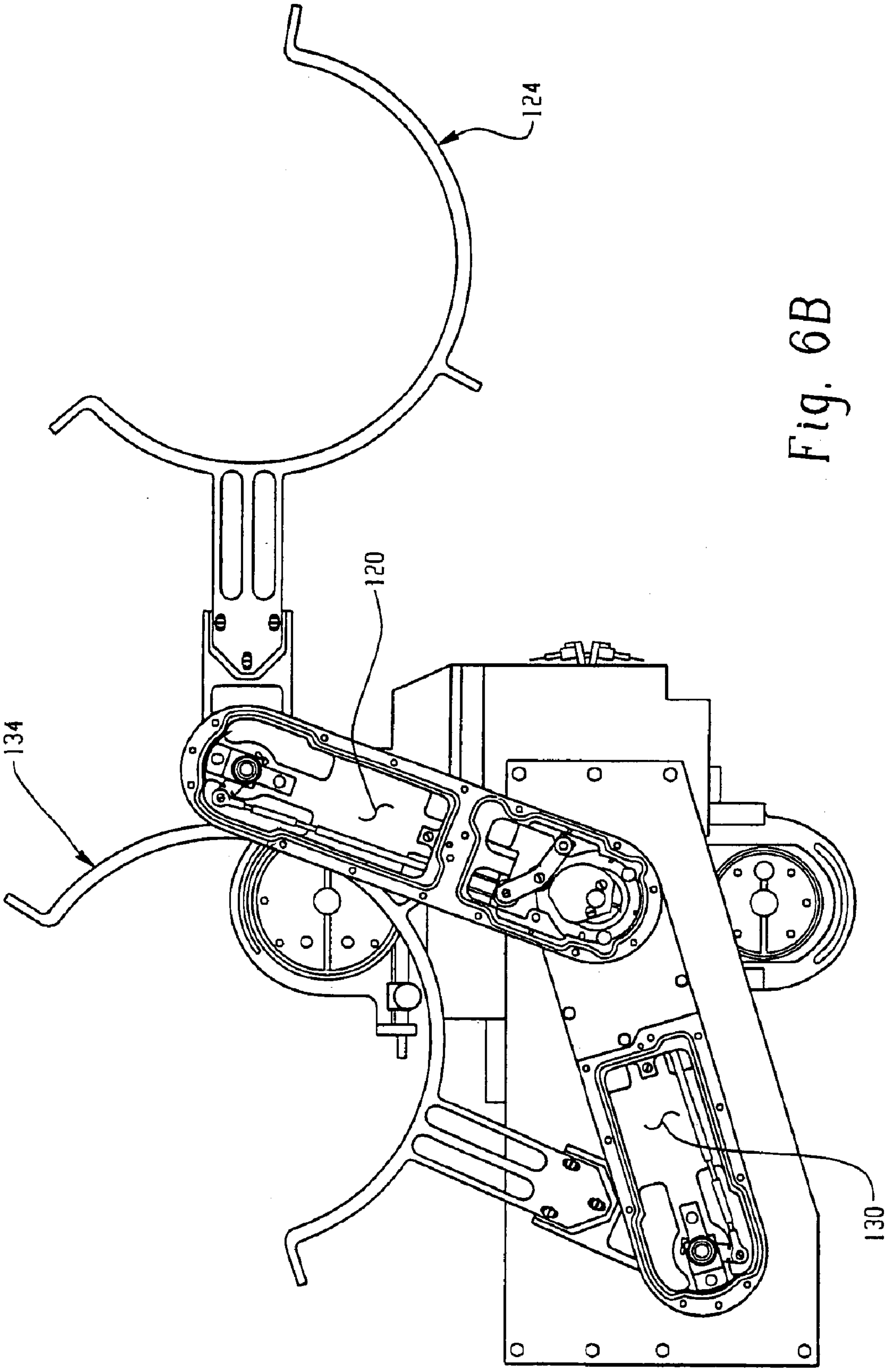

FIG. 6 illustrates a partial perspective view showing a first motor 210, a second motor 212, and a third motor 214 for articulating the upper and lower robot arms 120, 130 of the dual end effector wafer transport mechanism. The first motor 210, i.e., the z-axis motor, is used to drive the upper 120 and lower transfer arm assemblies 130 in parallel along their respective primary or first axis of rotation 140 in the vertical or z-axis direction. The second motor 212 drives the lower link arm 130 about its primary pivot axis 140 or rotationally about the z-axis. The third motor 214 drives the upper link arm 120 about the primary axis 140 in a similar fashion to the second motor. Preferably, the motors are DC servo or stepper motors.

Figure 7:
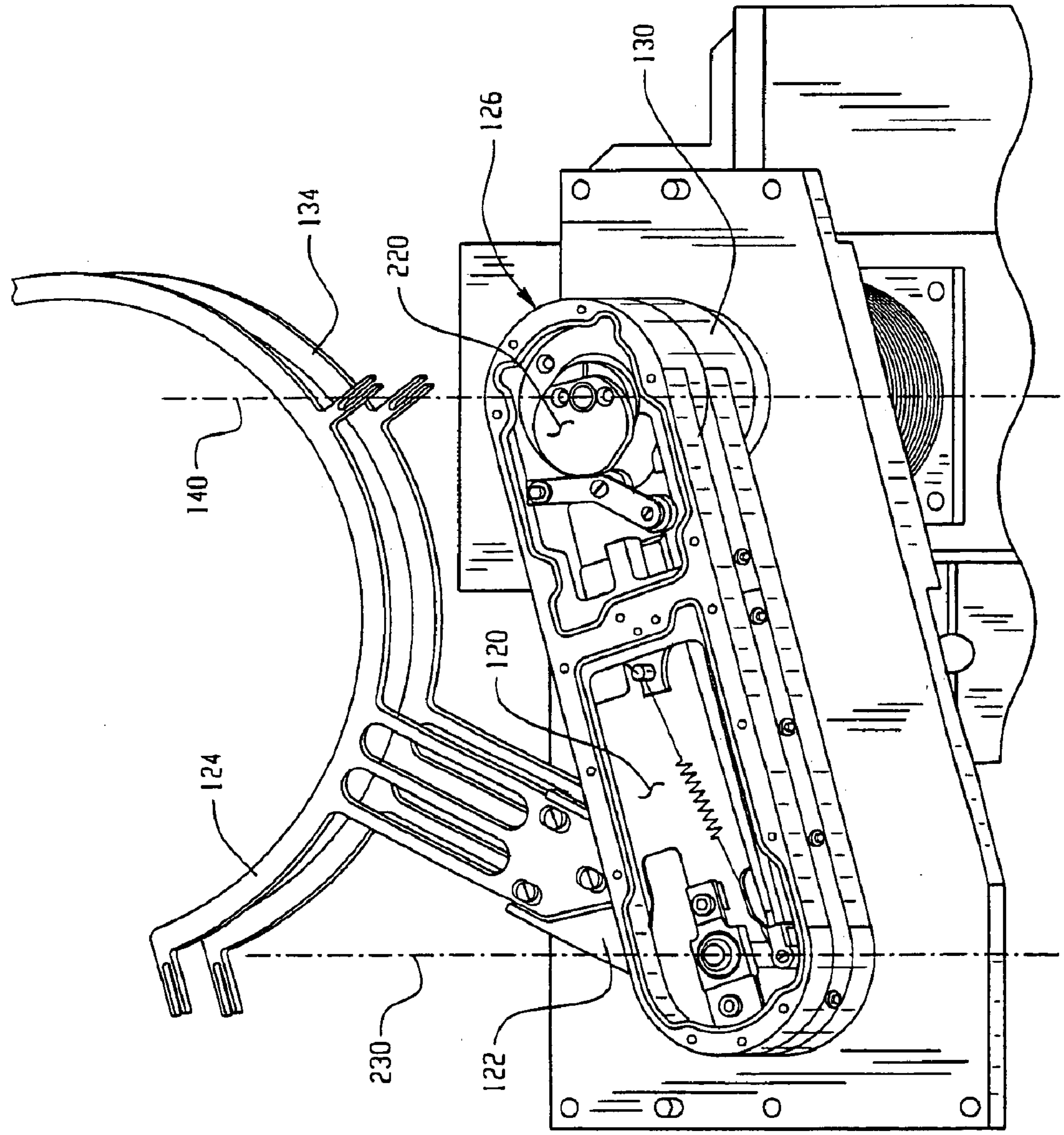
FIG. 7 shows a partial exploded perspective view of an upper link arm assembly (with vacuum cover removed) and an upper translating arm including an end effector attached thereto.
Figure 8:
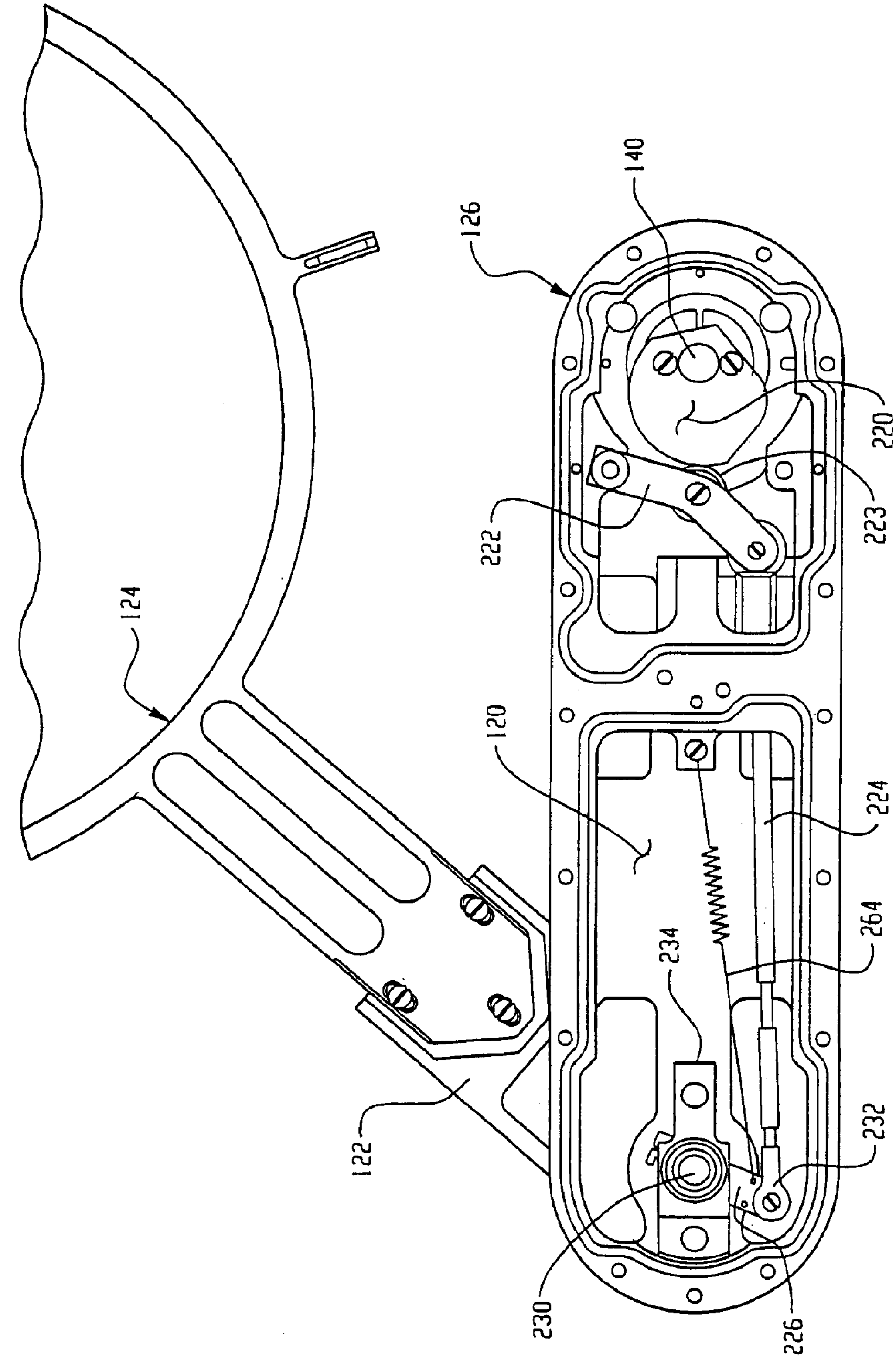
FIG. 8 shows a top plan view of the upper link arm assembly (with vacuum cover removed).

FIGS. 7–8 show a plan view and a perspective view of the upper robot arm 120. The arm 120 includes an elongated housing 126 having a removable two-piece cover 127 and 128 (see FIG. 3). The lower link arm 130 contains a similar structure and functions in the same manner. Because they are structurally similar to each other, the robot arm mechanisms 120, 122, 124 and 130, 132, 134 have corresponding components identified by identical reference numerals except where indicated. Accordingly, the following discussion is primarily directed to the construction and operation of the upper robot arm mechanism but is similarly applicable to the lower robot arm mechanism.

The two-piece cover 127 and 128 for the upper link arm 120 allows an operator easy access to the underlying mechanisms. Cover piece 127 provides access to the mechanism at the primary pivot axis 140 whereas cover piece 128 provides access to the mechanism at the secondary pivot axis 230. O rings (not shown) are preferably used to seal an inside volume of the robot arm 120. About the primary pivot axis 140, the upper robot arm 120 includes a cam 220, and a cam follower arm 222. The cam follower arm includes a bearing 223 for contacting the contour of the cam 220. An elongated arm driver 224 is attached to the cam follower 222 at one end and at its other end to a rocker arm 226 by a fork 232. The fork 232 and the upper driver arm 224 have complementary threads that allow tensile adjustment of the driver arm 224. The rocker arm 226 is mounted below a bearing plate 234. Rotation of the upper link arm 120 about the pivot axis 140 mechanically moves the cam follower arm 222 such that the upper translating arm 122 rotates about the secondary pivot axis 230 in the elbow of the upper arm 120 (distally from pivot axis 230). A return spring 264 is used to couple the rocker arm 226 to the housing 126 of the robot arm. The distal ends of the robot arms further include threaded holes 236, a rotary seal 238, bearings 240, and a pivot plate 248 for pivotably connecting the translating arm 122 or 132 to the respective link arm 120 or 132 (shown in FIG. 10).

The return spring 264 allows the cam follower 253 to maintain contact with a non-rotating profile of the cam 220 during rotation of the link arm. As such, the return spring maintains a constant load on the system to remove any manufacturing or mechanical tolerances within the linkage assembly. Advantageously, the use of the return spring 264 as shown does not require electrical or mechanical connection of the translating arm to the link arm such that the translating arm can be moved independently of the crank arm during set up and installation of the mechanism or in the event of wafer breakage/dislodgement.

Figure 9:
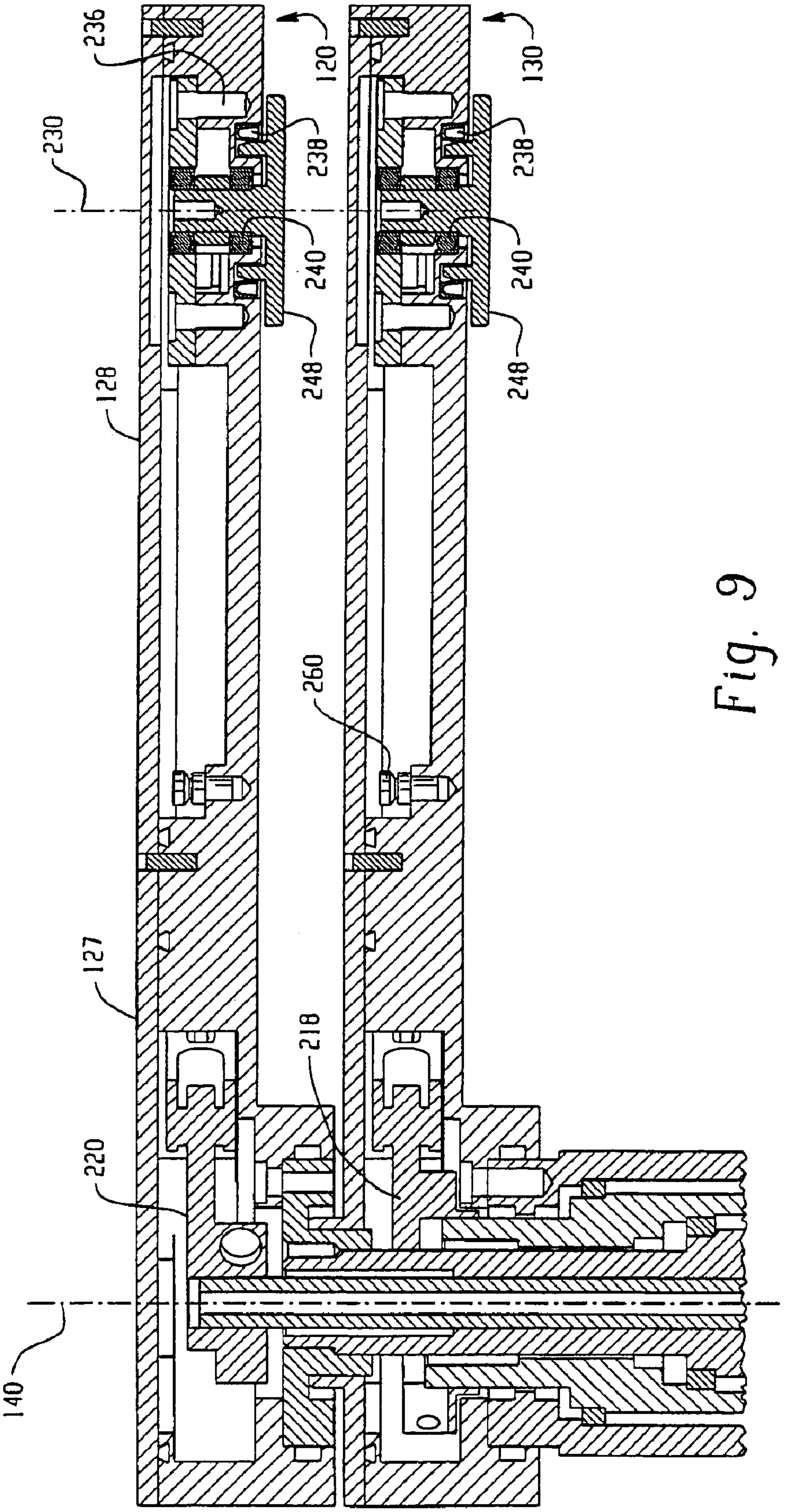
FIG. 9 shows a cross sectional view of the upper and lower link arm assemblies.
Figure 10A:
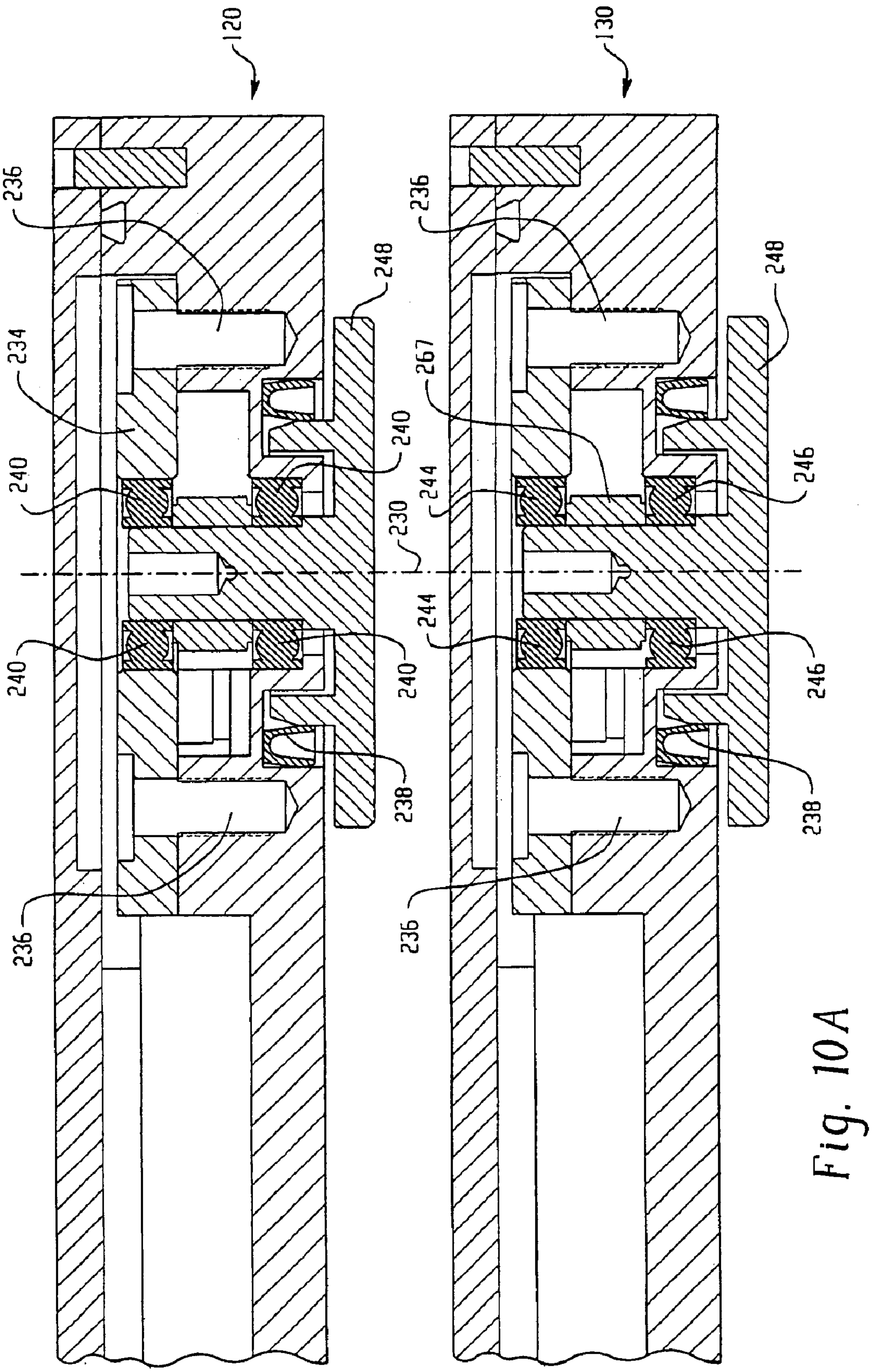
FIGS. 10(*a,b*) show cross sectional views of the translating arm assembly.
Figure 10B:
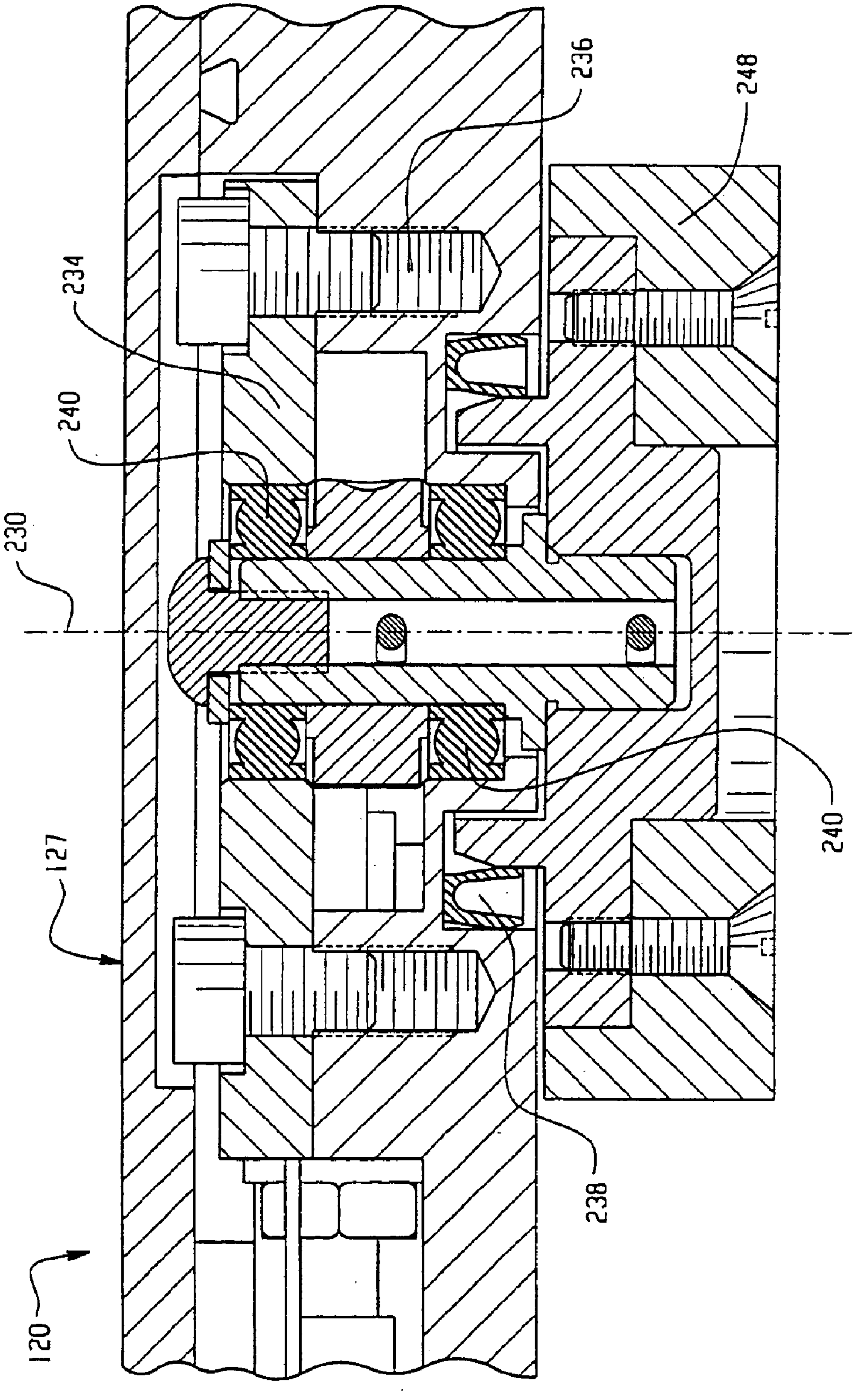
Figure 11:
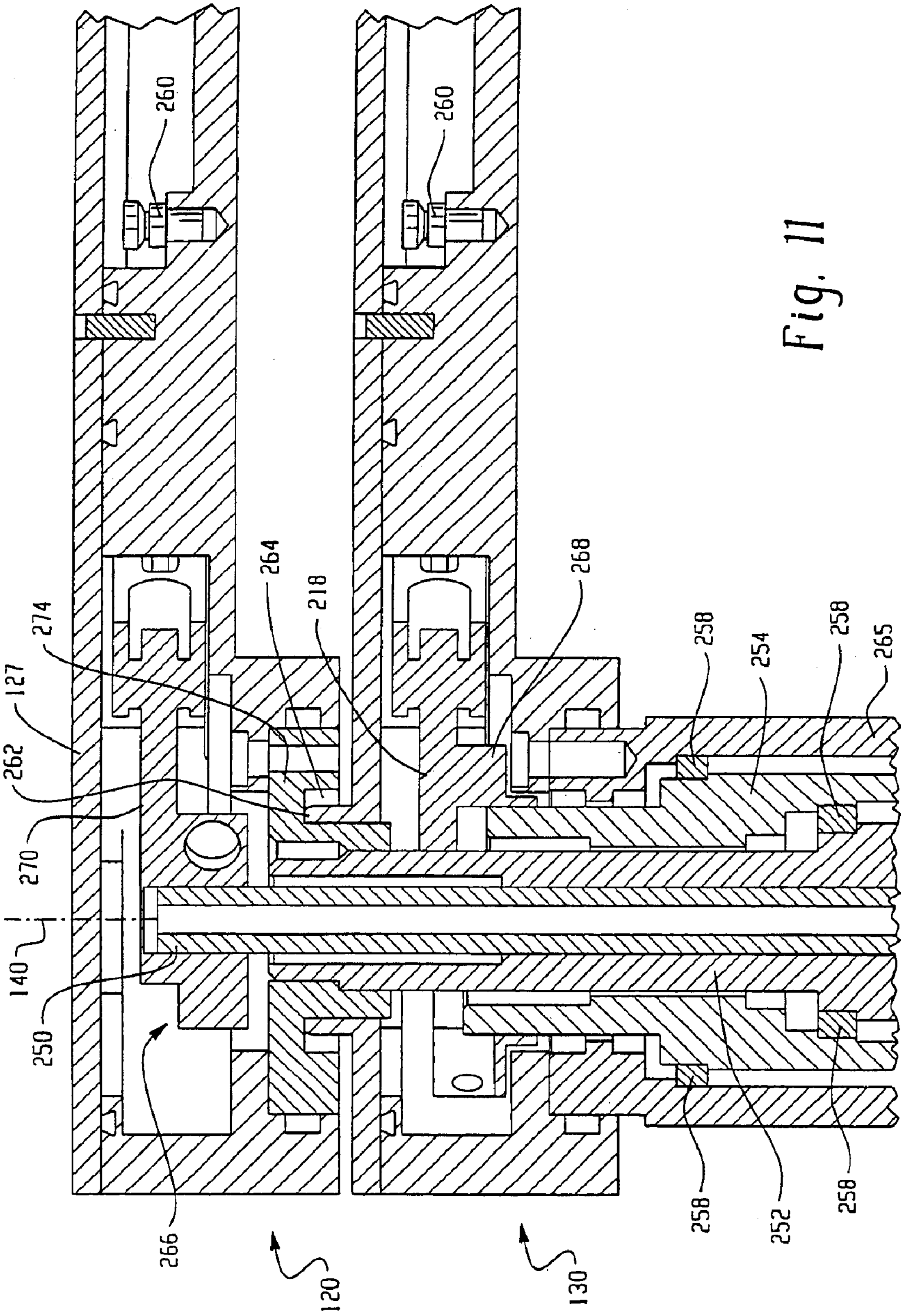
FIG. 11 shows a cross sectional view of the upper and lower link arm assemblies mounted to a coaxial shaft.

FIGS. 9–11 show cross sectional views of the upper and lower robot arms 120 and 130 as connected to a rotatable shaft assembly. As may be seen from these views, the lower link arm 130 also has a lower cam 218, which functions in the same manner as the upper cam 220. The cams 218, 220 are located coaxially with the primary pivot axis 140 and are rotationally fixed relative to the upper and lower link arms 120, 130. In this manner, as the link arms 120 or 130 rotate, the respective cams 220 or 218 engages a four-bar link mechanism (defined by elements 120, 222, 224, 226, and 232 as shown in FIG. 8; the four-bar link mechanism is identical in each link arm) contained entirely within the vacuum tight link arm housing 126. The four bar link mechanism causes rotary motion of the near, or first, translating arm end with respect to a far, or secondary, link arm axis 230.

By driving a link arm rotationally about its primary pivot axis with a programmable motor and driving a translating arm about its opposite end (elbow) with a cam, motion of a work piece located on a far, or second, end of a translating arm can follow a substantially straight line from the cold plate to the process chamber. Of course, by changing motor programs, cam profiles, or adjusting the length of a driver link contained as part of four-bar link mechanism, wafer motion path and final wafer position relative to a cold plate central axis or process chamber central axis can be changed.

At the primary pivot axis 140, the upper robot arm 120 is rotatably mounted onto a center (first) shaft 250 and a rotatable second shaft sleeve 252 disposed about the first shaft. The center shaft 250 is fixed to the housing assembly though a belt and pulley system. An upper arm mount 262 and a rotary seal 264 fixedly secure the arm 120 to the shafts 250, 252. The cam 220 is fixedly attached to the first shaft 250 to prevent rotation of the cam. In a similar manner, the lower robot arm 130 is rotatably mounted onto third and fourth shaft sleeves 254, 256 as shown. The third shaft sleeve 254 is fixed though a belt and pulley system such that it is non-rotatable whereas shaft sleeve 256 is rotatable. Cam 218 is fixedly attached to the third shaft sleeve 254 to prevent rotation of the cam. Shaft bearings 258 are disposed between the shafts to couple the rotating elements. The second shaft sleeve 252 rotates with respect to the first shaft 250 by means of a timing belt and pulley arrangement (not shown) driven by the second motor 212. Similarly, shaft sleeve 256 rotates relative to the housing by means of a timing belt and pulley arrangement (not shown) driven by the third motor 214. Upper and lower cam assemblies are designated 266, 268 in FIG. 11. Note that since the robot arms 120, 130 are hollow inside, vacuum may be maintained by exhausting through the shaft 250 since the cam 220 preferably has an opening in it. The upper and lower link arms include spring anchors 260 for coupling the rocker arm 226 with return spring 264.

Figure 12:
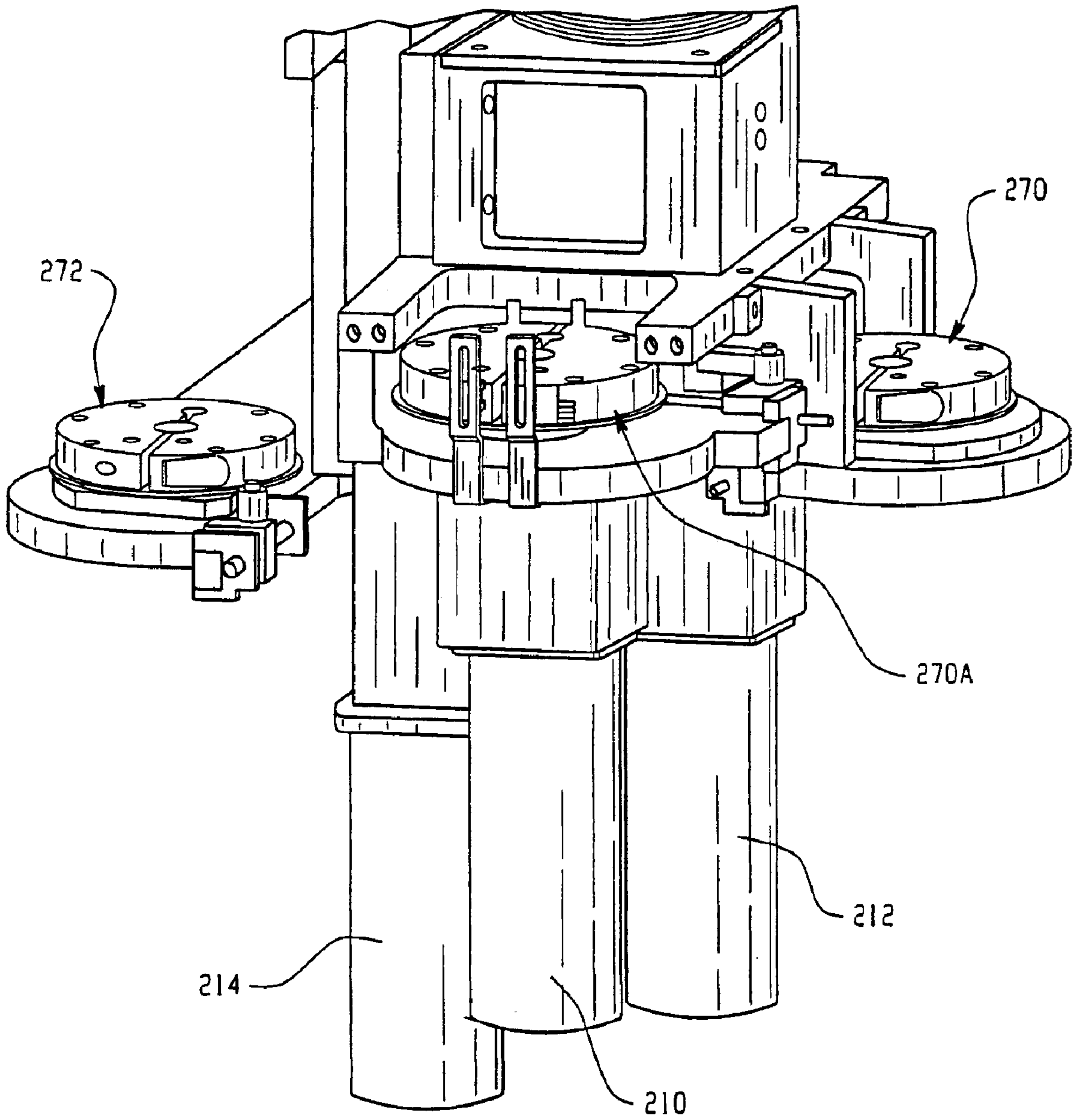
FIG. 12 shows a perspective view of the motor drive assembly.

FIG. 12 shows two clamps 270 and 272, which are used to adjust the position of the cams 220 and 276, respectively (the cams are not shown in this view) in each link arm 250, 260, respectively. A pulley and belt system is employed to adjust position of the cams. Belts (not shown) are mounted around the clamps 270, 272 and engage shafts 252 and 256 in order to adjust the position of the cams 220, 270. The second motor 212 engages clamp 270 to effect rotation of the upper link arm 120 whereas the third motor 214 engages clamp 272 to effect rotation of the lower link arm 130.

During a wafer exchange with an in-air robot (not shown in the figures), the upper end effector 124 and the lower end effector 134 can be coaxial. In addition, two wafers may occupy the loadlock chamber 102 simultaneously at the midpoint of a wafer exchange operation with the process chamber 104. The upper arm 120 and the lower arm 130 can articulate in a manner that allows a first wafer being removed from a process chamber 104 to pass under a second wafer to be placed in the process chamber 104 prior to being placed on the cold plate 130. The upper arm 120 and lower arm 130 may share a common primary axis 140 such that the first motor 210 (z axis motor) drives the arm assemblies 120 and 130 simultaneously along the primary pivot axis 140 in the z direction.

Rotation of the upper or lower link arm 120 or 130 about the primary axis 140 causes rotation of the corresponding translating arm 122, 132 and the attached end effectors, 124, 134, relative to the sub-chamber 116. Translation of the upper or lower translating arm 122, 132 relative to the sub-chamber 116 is therefore effected by the cams 220, 218. For example, the position of the cam 220 is fixed on a non-rotatable shaft 250 and coaxial with the primary axis 140 around which the second shaft 252 (see FIG. 11) and the upper link arm 120 can rotate. The cam follower arm 222 follows the profile of the cam 220 as the upper link arm 120 rotates about the primary pivot axis 140. Such motion causes reciprocation of the upper arm driver link 224 (or the corresponding element of the lower link arm 130), which are affixed to a cam link pin at the end of the cam follower arm 222. Such reciprocating driver link motion is converted to rotary motion through a pinned connection to the upper arm rocker link 226 thereby permitting the translating arm 122 to rotate approximately 57 degrees as the upper link arm 120 is rotated through 130 degrees by DC servomotor 212. The motion is identical for corresponding elements of the lower robot arm assembly.

The angular position of the cam follower 222 changes relative to link arm housing as the upper and lower link arms 120, 130 are driven around the primary axis 140 by a motor and timing belt arrangement. Pinned connections between the upper and lower arm rocker link 226 and a fixed length driver link 224 changes the angular position of the rocker links 226 relative to a link arm housing. An opposite rocker link end is attached coaxially to a first, or pivoting, translating arm 122 end in a manner that causes the translating arm 122 to rotate around the elbow of the upper arm 120.

As previously discussed, the far ends of the translating arms 122, 132 include end effectors 124, 134 such as an integrated wafer handling pan, or the like. The end effectors, 124 or 134, are configured to lift or place wafers onto wafer support pins 190, 192 and a pad of a temperature measuring device, e.g., a thermocouple 193 (see FIG. 6) within the process chamber 104, and place the wafer 194 on the cold plate 142 located within the loadlock chamber 102. The end effector 124 can be moved inside a circle described by the wafer support pins 190, 192 when removing or placing a wafer in the process chamber. In contrast, when placing the wafer 194 onto the cold plate 142, the end effector 124 or 134 moves up or down with the upper or lower link arm assemblies 120, 130 in a z-axis direction. The circular shape of the end effector 134 allows it to move down and around the perimeter of the cold plate 142, placing the wafer 194 onto the surface of the cold plate 142.

In a preferred embodiment, the cold plate 142 is of a smaller diameter than the wafer 194 to be processed, thus simplifying wafer placement by the end effectors 124, 134. Such a size difference can still result in uniform wafer temperature control because of processes used during pressurization and evacuation of the loadlock chamber 118. For example, the end effector 134 of the lower arm 130 is moved by the mechanism described above from the centerline of the process chamber 104 to the center of the loadlock chamber 118, exactly over a cooling station, i.e., cold plate 142. The wafer 194 is then placed upon the cooling station or cold plate 142 by the lower robot arm 130 immediately after retrieval. The circular shape of the end effector 134 supporting the wafer circumscribes the perimeter of the liquid cooled disc 142 as the robot assembly is allowed to move down in the negative z-axis direction so as to place the wafer on the surface of the liquid cooled disc or cold plate assembly. This allows the wafer to be cooled slowly as the loadlock chamber 118 is taken from a vacuum condition, typically at 0.1 to 1.0 torr to atmospheric pressure. The venting of the loadlock chamber 118 is required to effect a change in a gas conduction heat transfer coefficient between the cooled plate surface and the wafer backside from 0.1 to 10.0 torr, and from 10 torr to atmospheric pressure to allow gas convention to cool the wafer. The change or increase in the heat transfer coefficient or the vent to atmosphere time being desirable or in fact required to prevent mechanical stress in the wafer and the resulting deformation and possible damage. As the loadlock chamber 118 is vented to atmospheric pressure, the cooling method described above combined with the high thermal conductivity of silicon wafers, provides even temperature distribution across a wafer surface as the wafer is cooled from process temperatures. This method is particularly applicable to a copper process, where the temperature of the wafer must be lowered before the wafer 194 is exposed to an atmosphere containing oxygen.

In the description above, pivots of articulated wafer transport arms are not centrally located within the loadlock chamber 118. Further, the wafer transfer path does not cause the central wafer axis to pass over, or even come approximately near, wafer transport arm primary pivot axis 140. Such an arrangement allows the entire transport mechanism to be more compact, thereby reducing the size of the chamber 118. Such an arrangement also allows the wafer transport arms to be housed in a separate sub-chamber for simplified setup and repair.

It will be appreciated by one of ordinary skill in the art that the structure of the wafer transport mechanism described above has a relatively small footprint in comparison to prior art systems. In the structure of the preferred embodiment, linear motion of the wafer 194 may be accomplished by a fairly simple compact mechanism. Most of the transport mechanism can fit into the sub-chamber 116 that is relatively small compared to the size of the loadlock chamber 118.

It will also be appreciated that providing a removable sub-chamber 116 simplifies maintenance considerably. This is particularly important in semiconductor fabrication facilities, where access to machinery located within the clean room is often limited, and where it is often desirable to avoid entry of humans into the clean room. Many clean rooms provide access panels so that personnel outside the clean room can have easy access to the equipment within the clean room without actually entering the room. Thus, the present invention allows for easy removal of the robot arm mechanism for maintenance and repair.

It will also be appreciated by one ordinary skill in the art that the wafer transport mechanism of the present invention may be either "right handed" or "left handed." In other words, if FIGS. 1 and 2 show a "right handed" embodiment, with the sub-chamber 116 located on the "right", it will be readily appreciated that the same structure will operate equally well in a "left handed" loadlock chamber. Preferably, as may be readily seen from the figures, most of the parts are designed identically for both a right-handed and a left-handed mechanism. Thus, to the extent that clean room geometry and existing equipment located within it require either a "left handed" or a "right handed" loadlock chamber 118 and sub-chamber 116, the embodiments illustrated above are easily adaptable to both versions, with only a small number of parts that need to have either a "left" and/or "right" orientation. This provides considerable benefits in the manufacturing of the wafer transport mechanism.

It will also be appreciated that the ability of the wafer transport mechanism to move a wafer 194 linearly between the loadlock chamber 118 and the process chamber 104 allows for a considerable reduction in the size of the loadlock chamber 118. In other words, as may be readily understood from the figures, with a linear motion of the wafer 194 between the cold plate 142 within the loadlock chamber and its final position within the process chamber 104, the internal dimension in the Y direction of the loadlock chamber 118 (i.e., transverse to the motion of the wafer 194) needs to be only slightly larger than the dimension of the wafer 194 itself (not including the dimension of the sub-chamber 116, of course). On the other hand, with a wafer transport mechanism that effects a substantially curvilinear, rather than a linear, motion in order to transport the wafer 194 from the cold plate 142 to the process chamber 104, the dimension of the loadlock chamber 118 would have to be substantially larger. The ability to minimize the footprint of the loadlock chamber assembly 102 provides considerable advantages to a semiconductor manufacturer since a smaller footprint allows for more effective utilization of expensive clean room space. It is understood, of course, that "linear" in this context does not refer to perfect linearity, but rather, motion that is substantially in a straight line. Although linear motion of the wafer 194 between the loadlock chamber 118 and the process chamber 104 is preferred, curvilinear motion is also possible. It should be clear that the prior art's use of a loadlock chamber, transfer chamber and cold plate can occupy a significant amount of real estate relative to the single or dual wafer process chamber. In the case of the cluster tool, the transfer chamber is usually large enough to allow the attachment of multiple process chambers, either single or dual wafer. A complex motion is typically required of the robot mechanism located in the transfer chamber, which may require it to be mechanically complex and costly. As such, a typical "cluster" tool containing more than one process chamber has a single transfer chamber to shuttle wafers between the loadlock chamber(s) and the process chamber(s).

The apparatus and process presented here reduces the size, internal volume, complexity, and cost by combining the operations described above into a single chamber with a robot that includes only a simple straight line end effector motion. Since serviceability is increased, size is reduced and cost per unit is reduced, each process chamber in the tool can be equipped with a separate loadlock chamber assembly that combines the previously described functions of the prior art loadlock, transfer chamber, and cooling chamber. In addition to the above advantages, each loadlock/process chamber module can function independently. This modularity allows the process tool to continue functioning should one or more loadlock/process chamber modules require servicing, typically this is not the case with a cluster tool arrangement as all the process chambers are interconnected to a single wafer transfer chamber, and if it should fail, the entire tool is disabled.

It will also be appreciated by one of ordinary skill in the art that the wafer transport mechanism described above is comparatively simple and easy to manufacture. For example, only a total of three motors are needed. These include the (z-axis) first motor 212, the second motor 212 for rotating the upper link arm 120, and the third motor 214 for rotating the lower link arm 130. This compares to much more complex prior art systems, which require either a complicated system of belts and pulleys, or, alternatively, two motors per arm (plus the Z axis motor), in order to effect rotation of a link arm about a primary pivot axis and rotation of a translating arm about a secondary axis. Thus, the apparatus provides considerable simplification over many conventional systems due to elimination of two motors from the overall mechanism.

Alternatively, it is also possible to use only two motors in the entire system instead of three. For example, a z-axis motor, and a single motor to rotate both the upper arm 120 and the lower arm 130. A clutch may be used to alternately couple the single motor to either the upper arm 120, or to the lower arm 130 since they do not operate simultaneously in a typical wafer transfer sequence. Any number of methods may be used to accomplish this. One method includes the use of two coaxial shafts with a splined clutch sleeve sliding up and down externally splined shafts to couple to either the shaft connected to the upper arm 120, or to shaft connected to the lower arm 130. Other methods will be apparent to one of ordinary skill in the art in view of this disclosure.

It will also be understood by those in the art that although in most of the figures, the motors 212, 214, and 216 are positioned below the loadlock chamber assembly 102, the apparatus is not limited to any particular location for the motors. For example, the z-axis motor 212 may be located above the loadlock chamber assembly 102, rather than below it. Similarly, the motors 214, 216 for rotating the link arms 120, 130 can also be positioned above the loadlock chamber assembly 102, or to the side of it. It is believed, however, that positioning all the motors below the arm assembly is preferred from the perspective of avoiding particles that may contaminate the loadlock chamber assembly 102.

Additionally, by utilizing a dual cam arrangement for each arm, the path of the end effectors may be varied. By using a "split" cam profile in the mechanism described above, the cam profile can be "adjusted" after the device is assembled and installed such that effectively any reasonable motion, i.e. other than straight line, can be obtained within the confines or path described by the loadlock centerline to the process chamber centerline. This allows independently selectable or adjustable motion of the translating arm relative to the link arm to be obtained without using a second servomotor or a motor controller and associated software. In this embodiment, the housing assembly would contain 3 concentric shafts as follows:

a. A rotating innermost or first shaft, an upper arm, as previously described, being mechanically fixed to the shaft by means of the vacuum tight top cover. The upper arm and innermost or first shaft being rotated with respect to the housing and center shaft by means of a timing belt and pulley arrangement driven by a first DC servomotor;

b. A second shaft assembly surrounding and being concentric with the innermost or first shaft, the second shaft is fixed and non-rotating with respect to the housing. The second or center shaft assembly includes two non-rotating cam assemblies mechanically fixed to the shaft, the cam assemblies placed vertically on the shaft such the cam profile is parallel to the long axis of the shaft. The lower cam assembly drives the lower robot connecting link whereas the upper cam assembly drives the upper robot connecting link as described above. Each cam assembly contains two cams, independently adjustable, for determining the retract position of the wafer end effector and the extend position of the wafer end effector; and c. An outermost or third shaft (outermost sleeve) that rotates with respect to the housing and the center or second shaft by means of a timing belt and pulley arrangement driven by a second DC servomotor.

Preferably, the lower link arm has a first end that is mounted to the end of the outermost or third shaft. The upper link arm has a first end is mounted to the end of the innermost or first shaft (sleeve). The shaft is connected to the upper link arm by means of the crank arm lid.

The cam and 4-bar link mechanism drives (rotates) the translating arms relative to the link arms as previously described above, except for the following: a cam assembly that consists of 2 independently adjustable cams. The first or retract cam in each assembly cam is mounted or fixed to the second or center non-rotating shaft. A second cam or extend cam is attached to the first cam in each assembly. The second cam can be moved or adjusted relative to the first cam by means of a pivot point common to both cams such that the cam profiles maintain a common plane of alignment and share a common point of tangency. The second cam can be rotated about the pivot point or common point of adjustment by means of an eccentric, whereby the extend position of the translating arm is adjusted using the eccentric. The retract position of the connecting arms can be adjusted by loosening the belt drive locking device. The cam follower bearing is in contact with the first or lower cam in each cam assembly during the retract portion of the crank arm motion and is in contract with the second or upper cam in each cam assembly during the extend portion of the crank arm motion. The follower cross over point defines the point of tangency.

Figure 13:
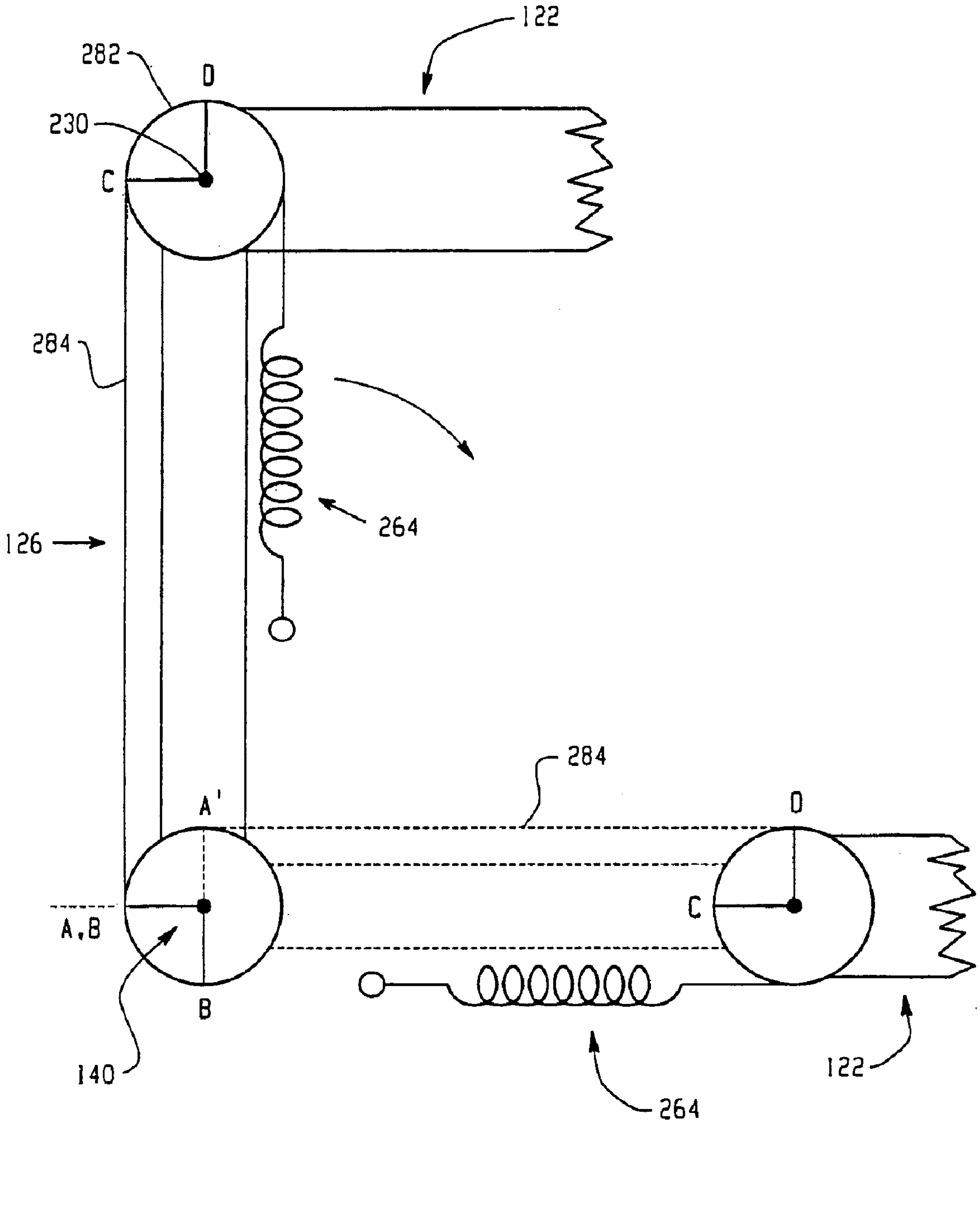
FIG. 13 shows an alternate embodiment for connecting the link arm to the translating arm.

In FIG. 13, a cable 284 wraps around a pulley 282. Rotation of the link arm 126 about its pivot point 140 extends the translating arm 122 in the desired direction, e.g. towards the process chamber 104. The length of the spring 264 increases as the entire arm 120 (or 130) rotates about its pivot point 140. When the arm 120 (or 130) needs to return to its folded position, the spring 264 contracts and provides the energy for the return.

Figure 14:
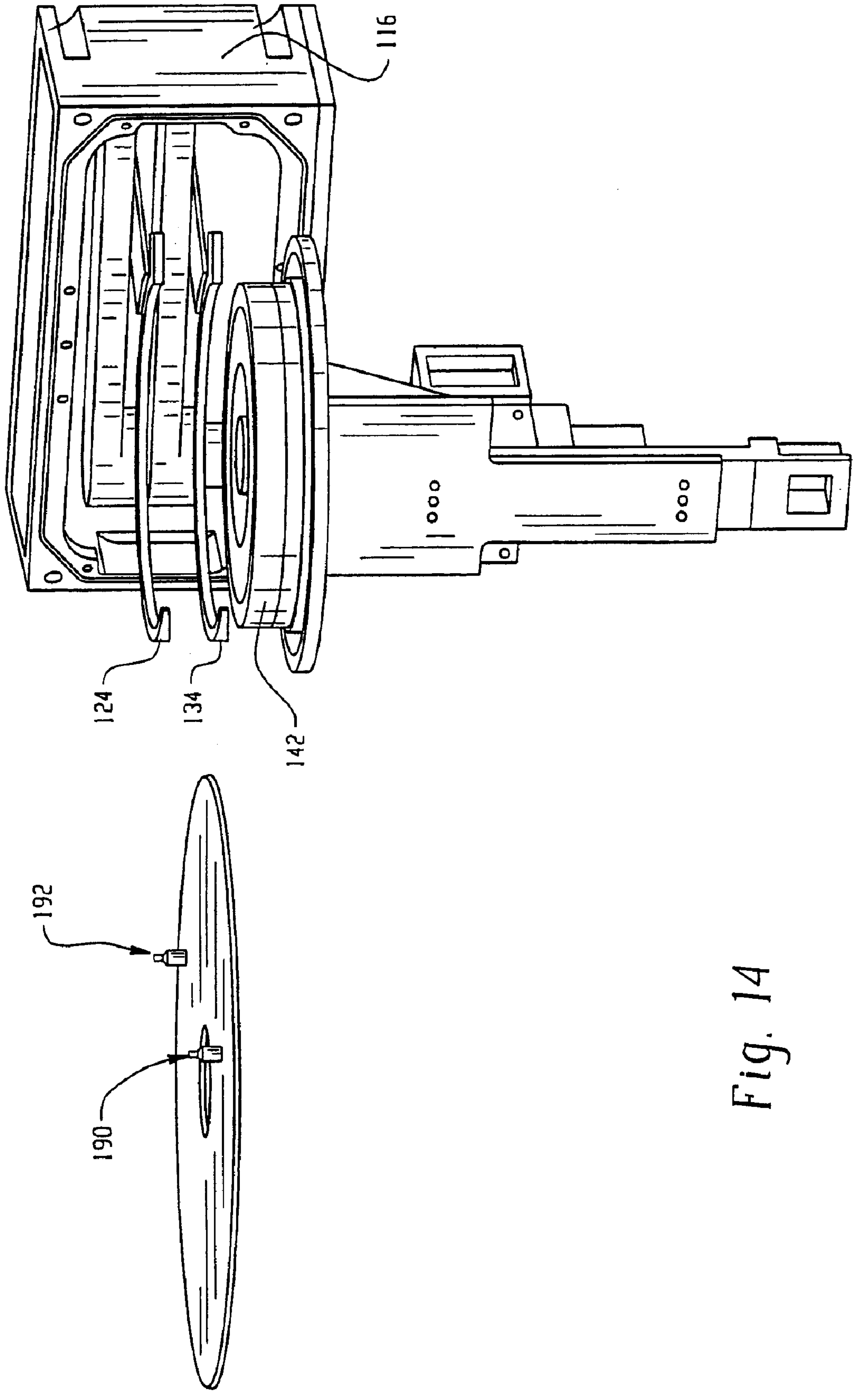
Figure 15:
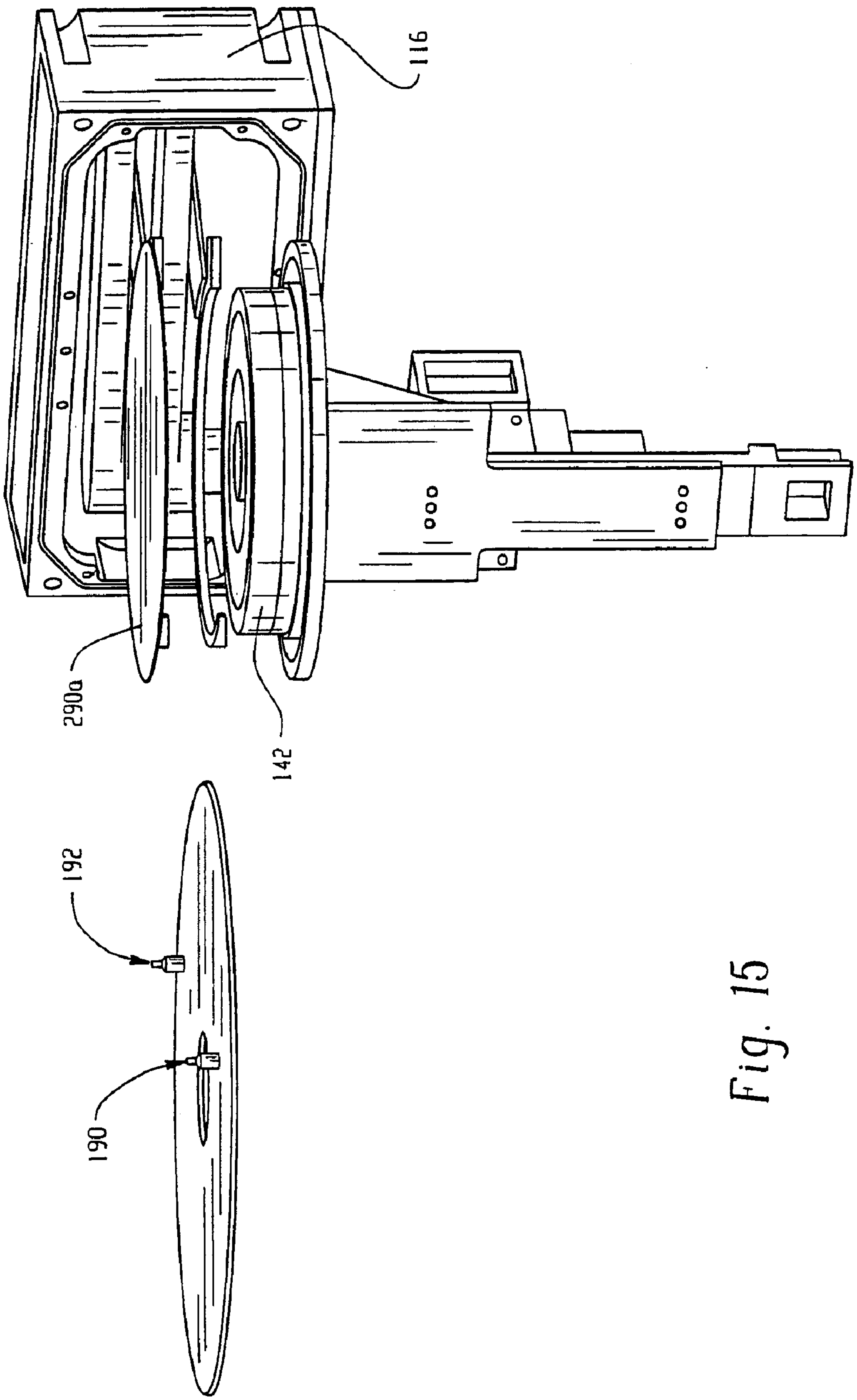
Figure 16:
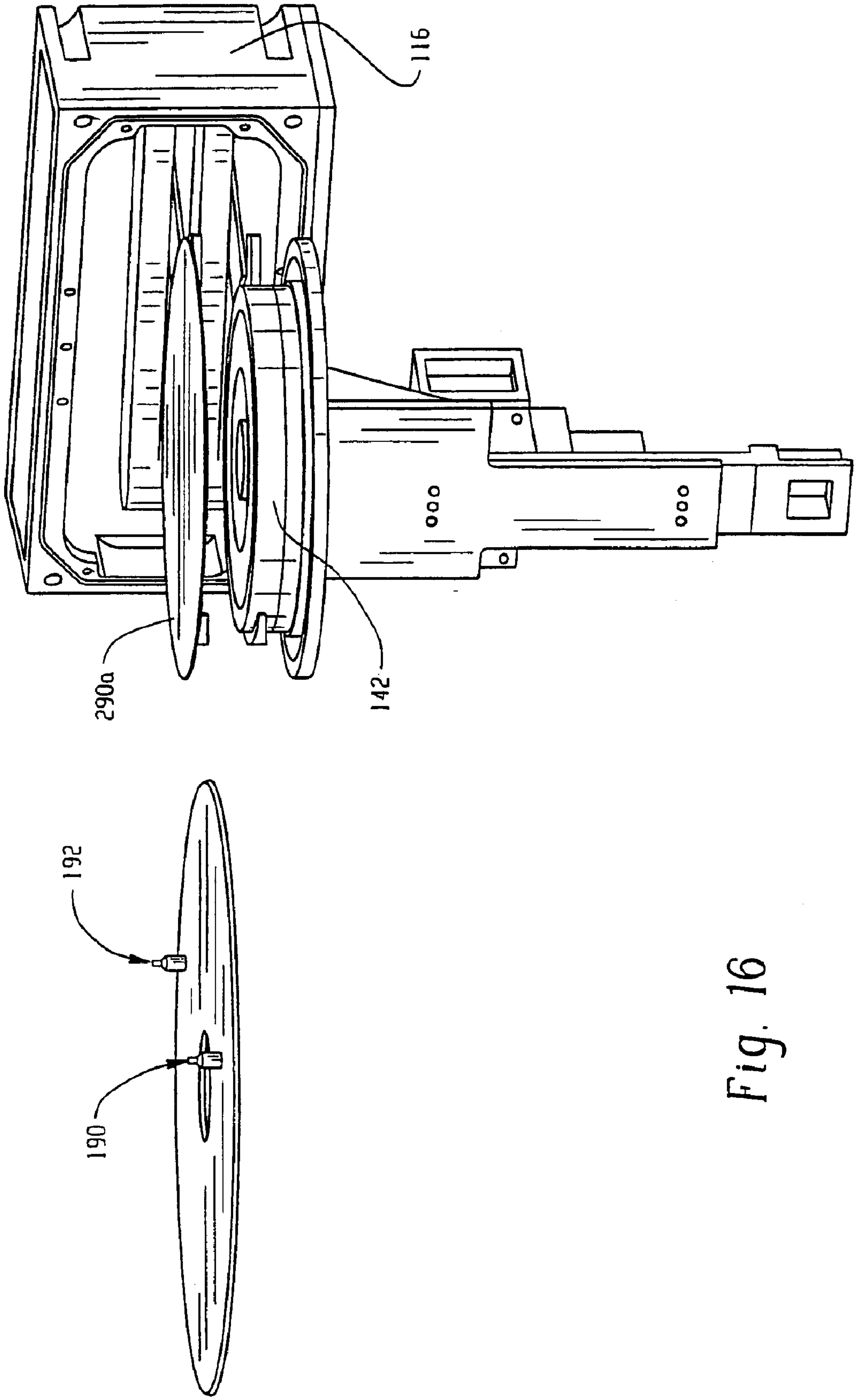
Figure 17:
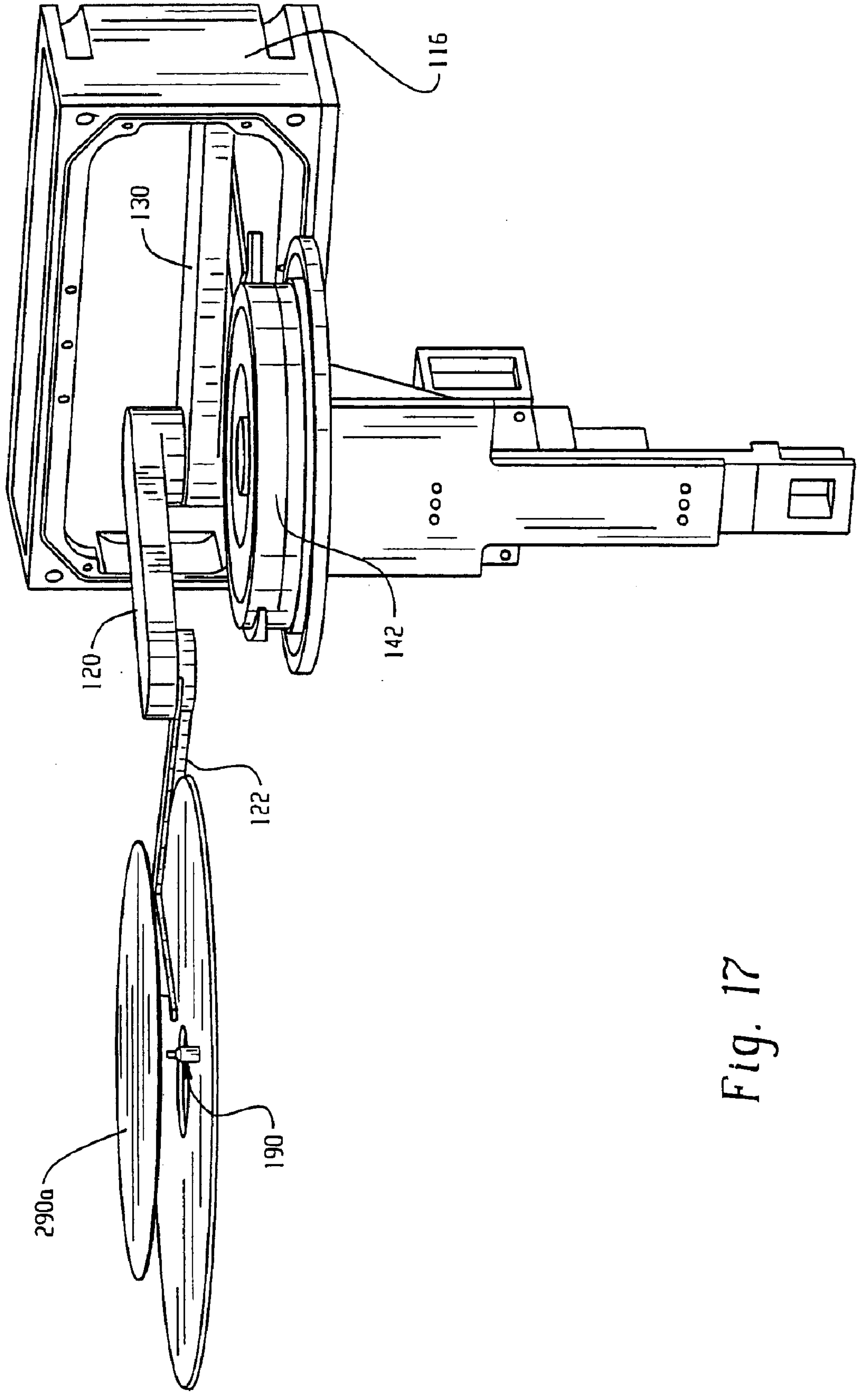
Figure 18:
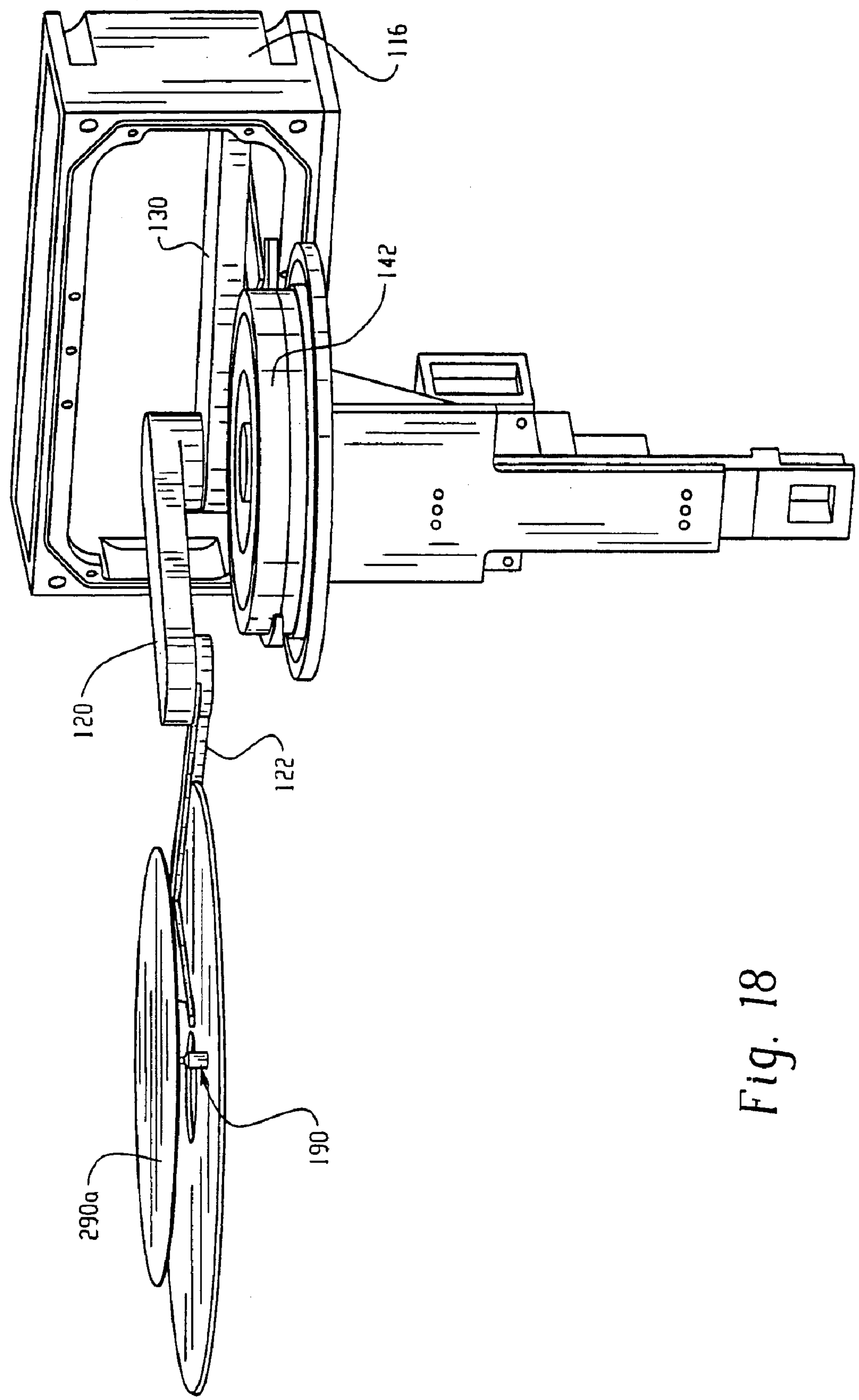
Figure 19:
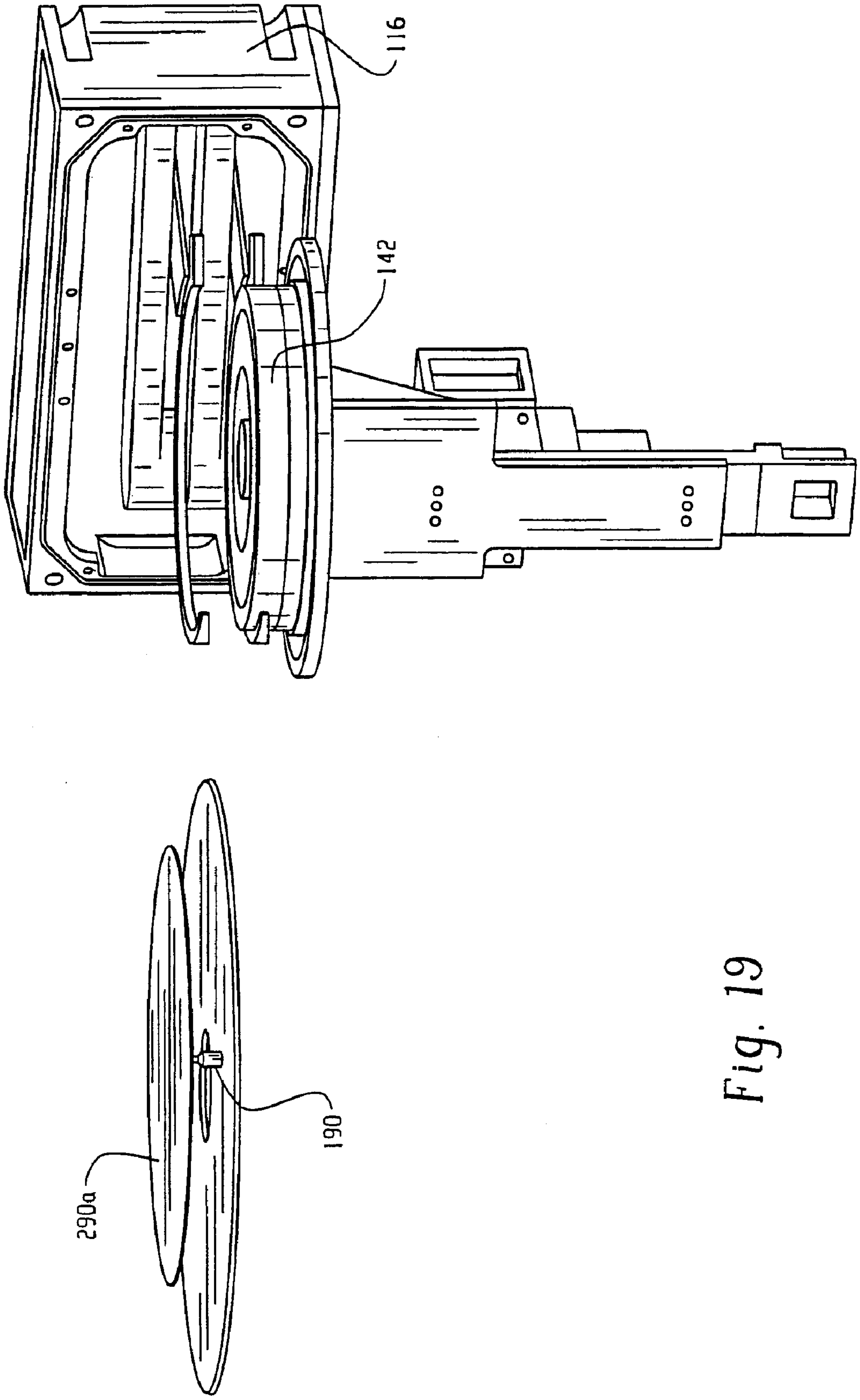
Figure 20:
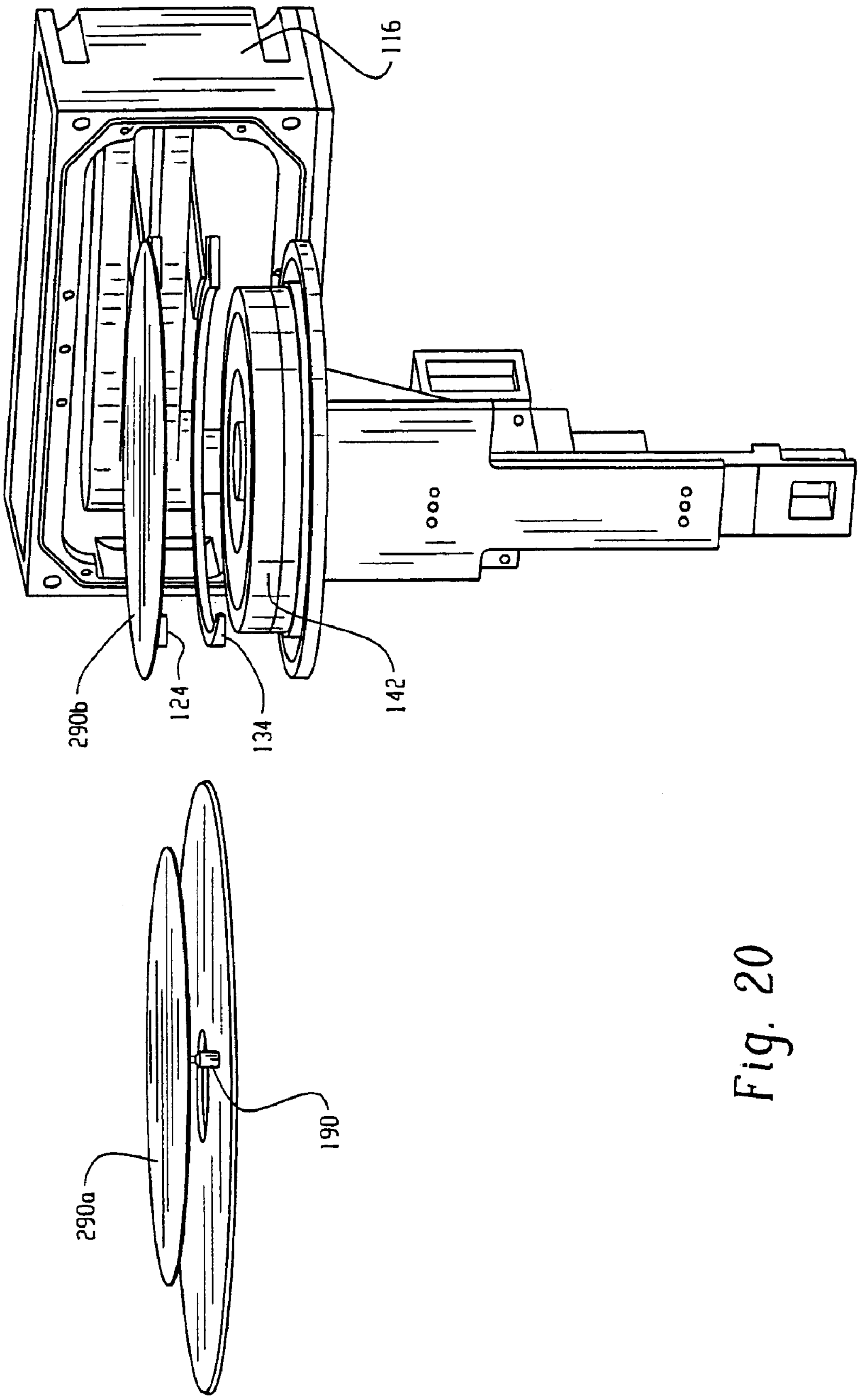
Figure 21:
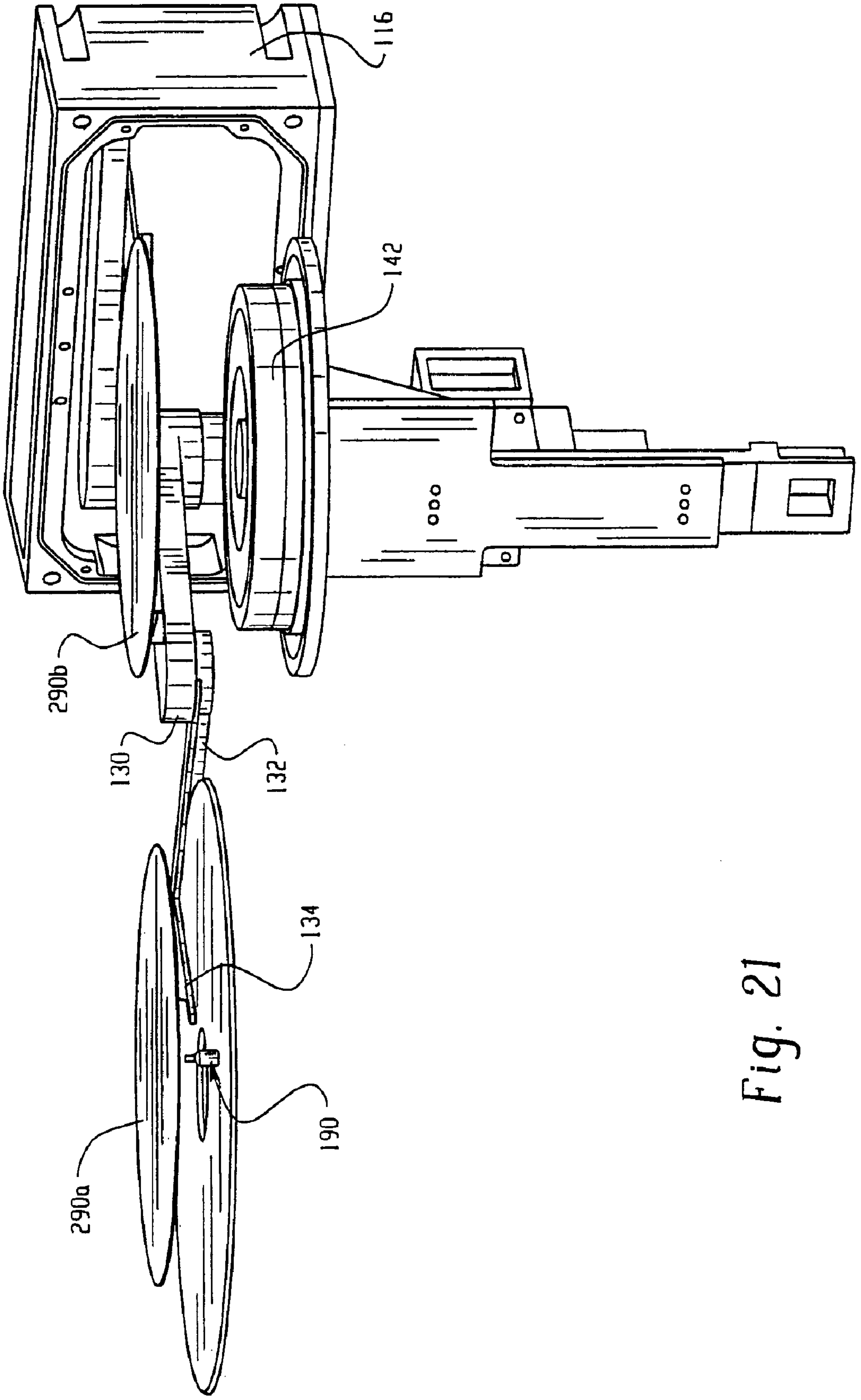
Figure 22:
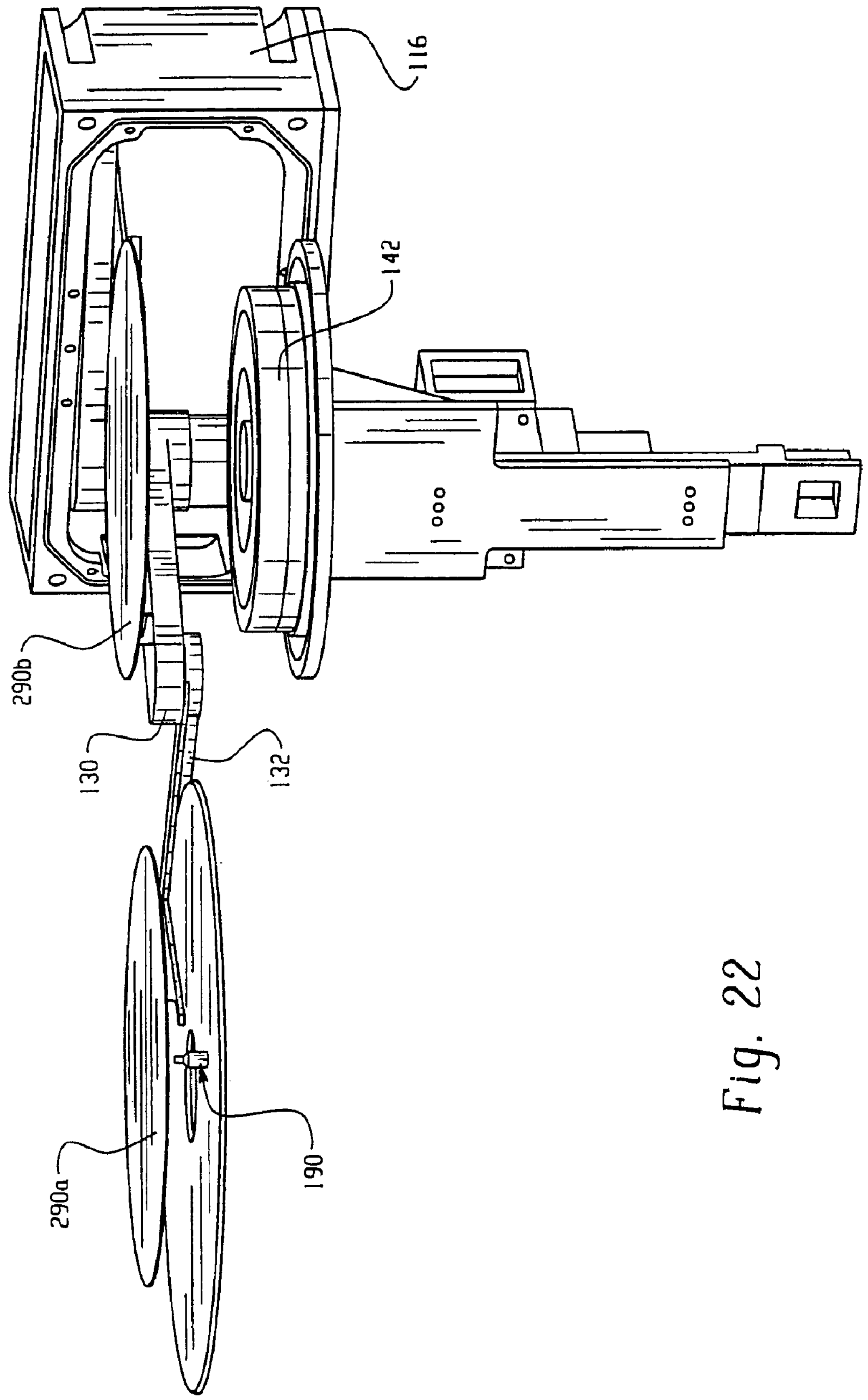
Figure 23:
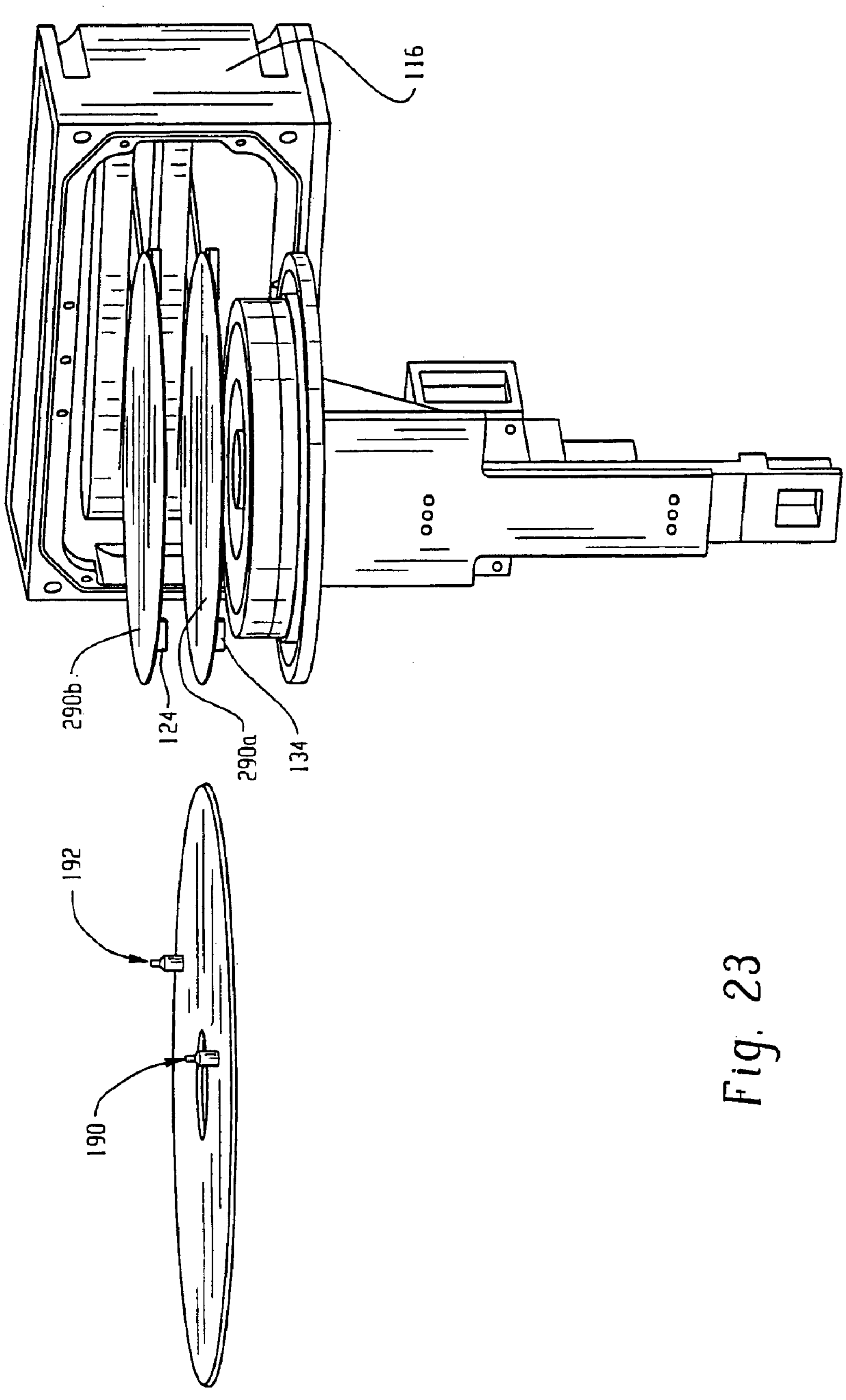
Figure 24:
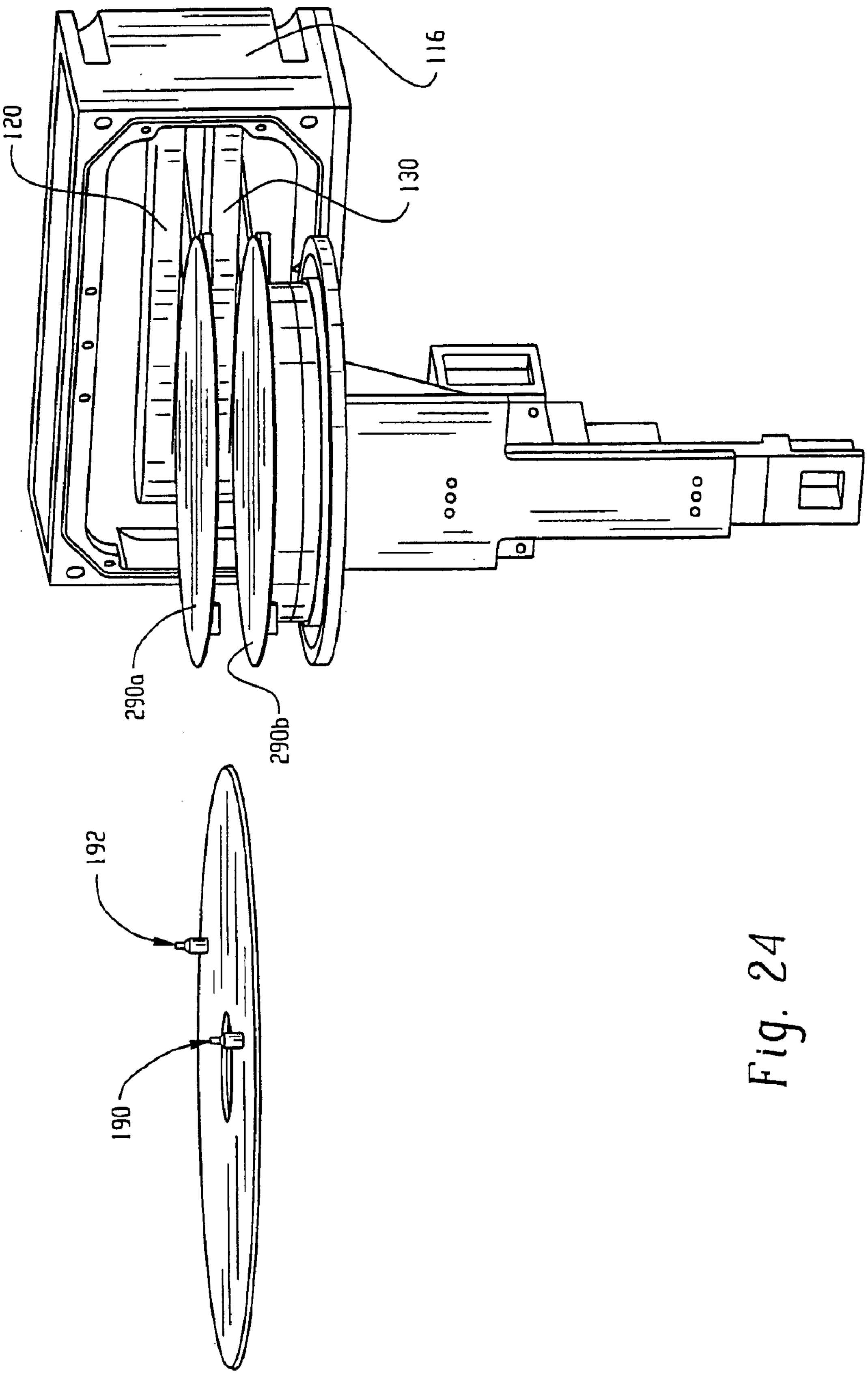
Figure 25:
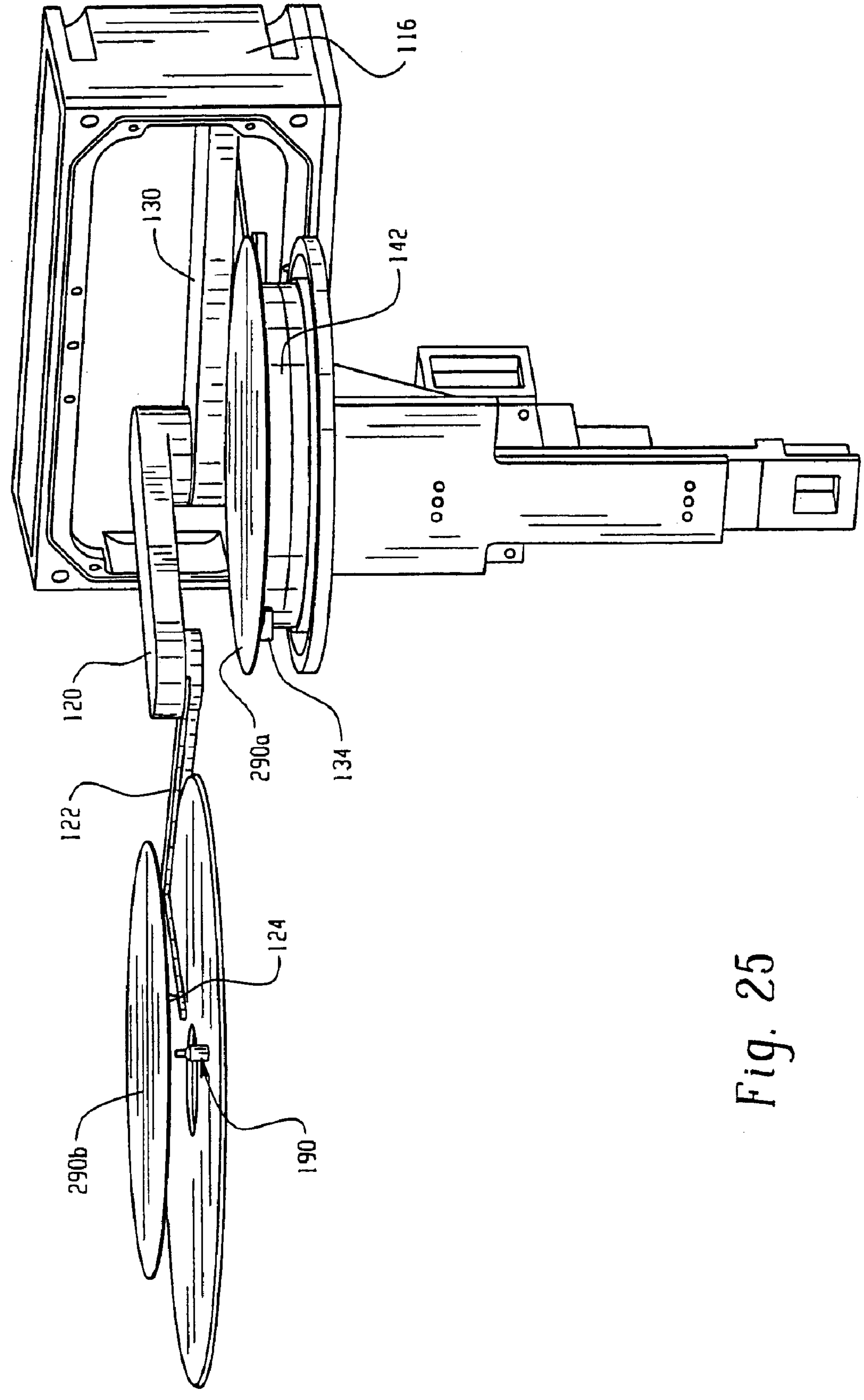
Figure 26:
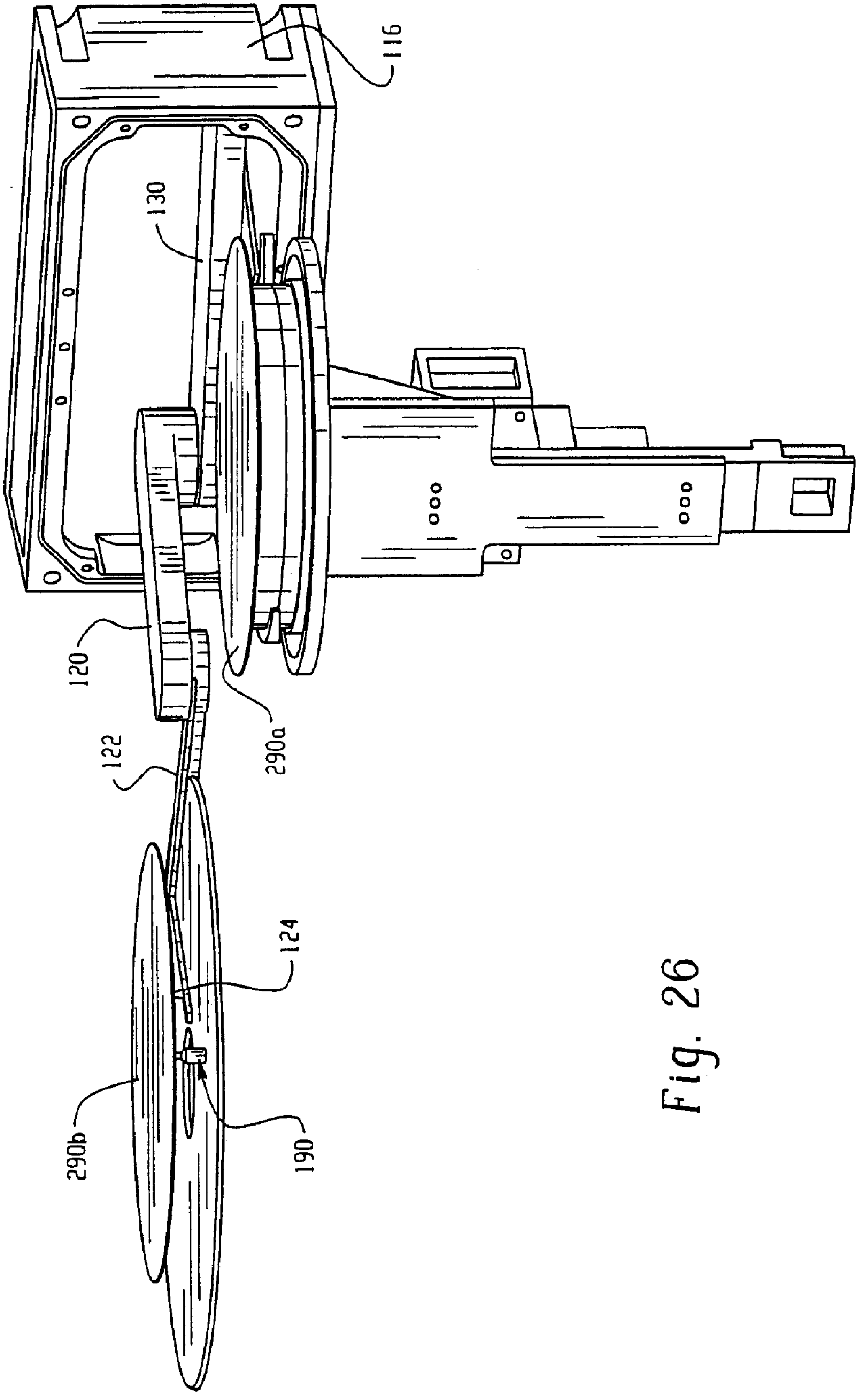
Figure 27:
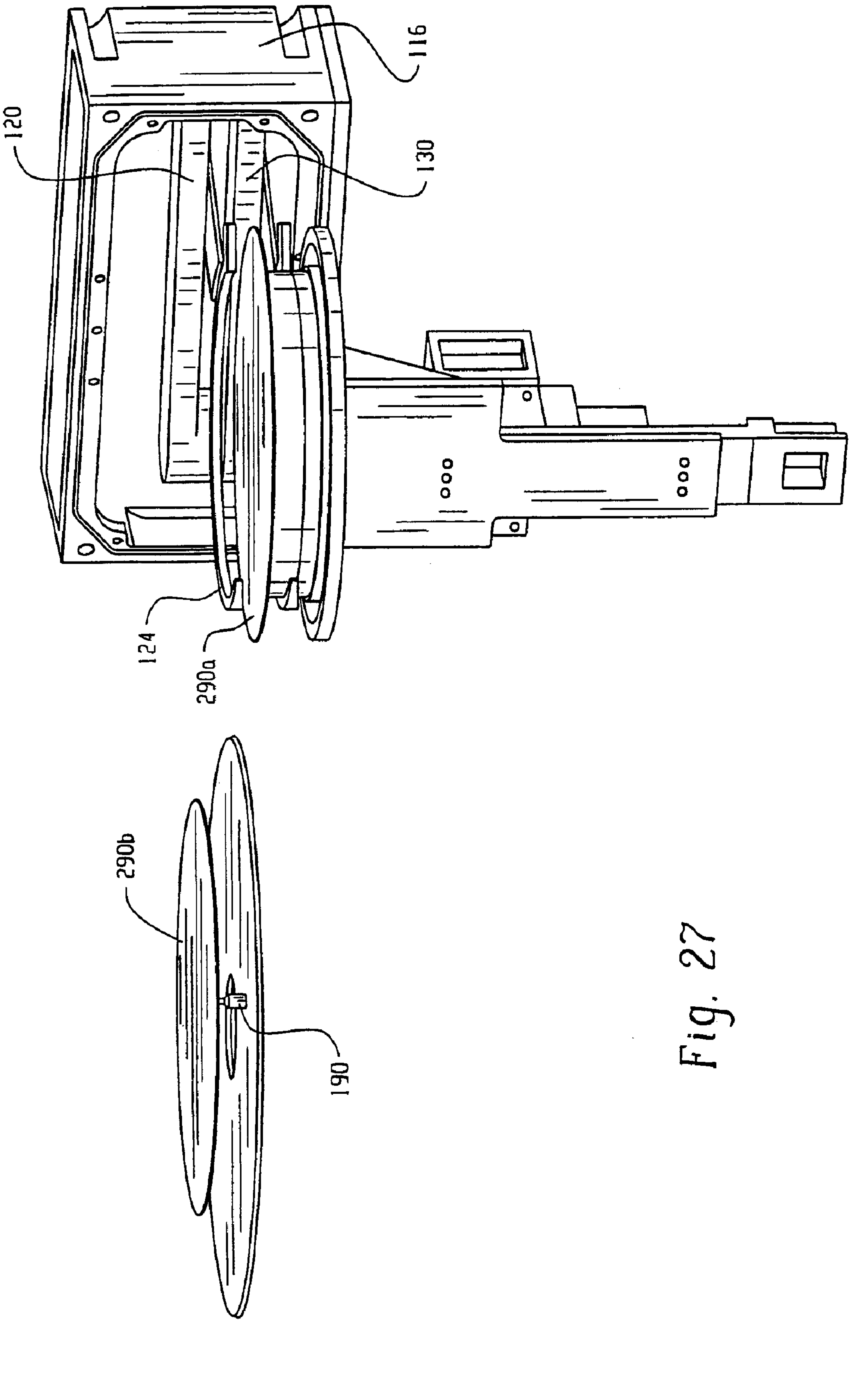
Figure 28:
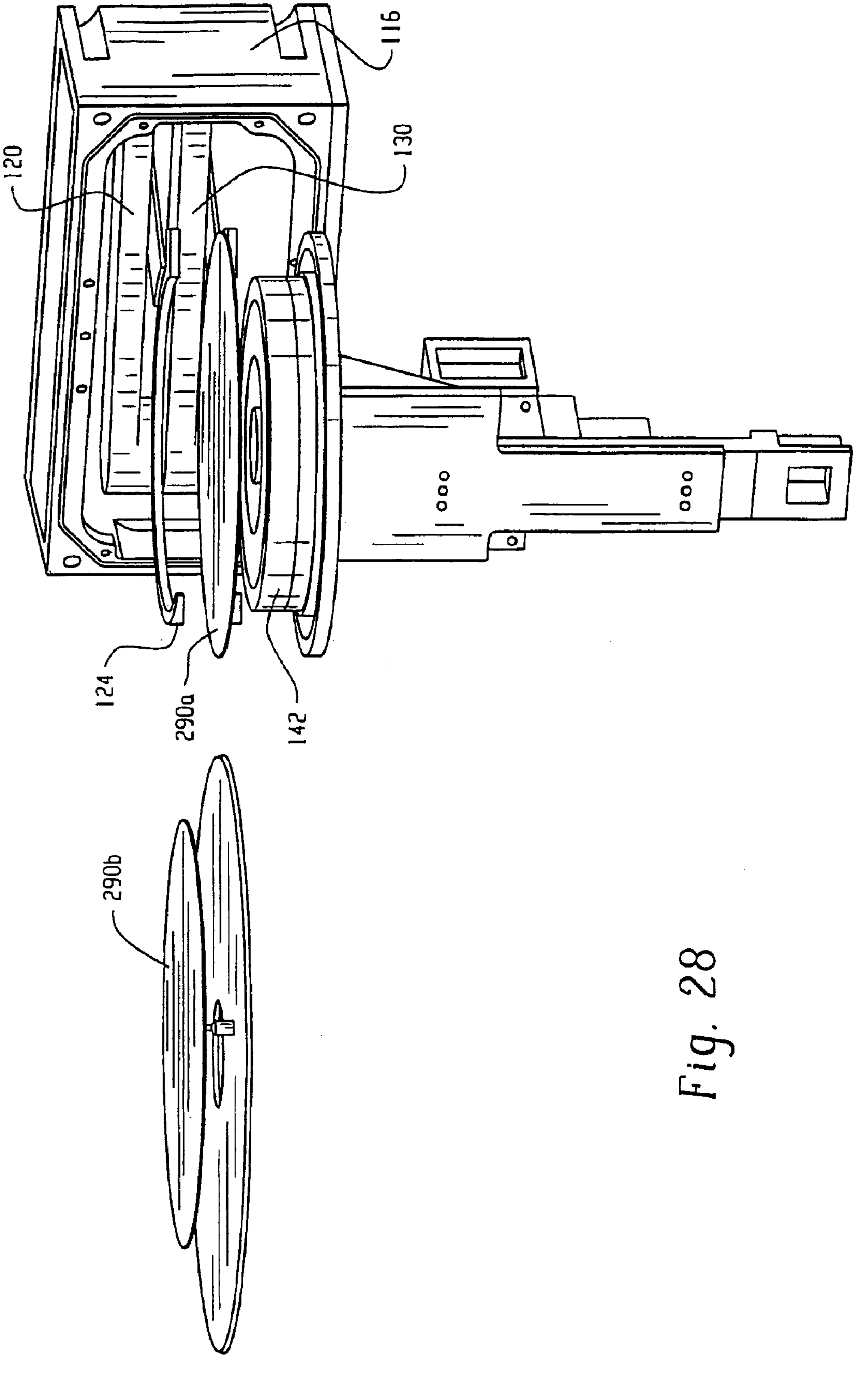

In robot operation, there are four positions of "Z" motion (up/down motion): (1) high; (2) mid-high, used in "in-air" wafer exchange; (3) mid-low; and (4) low. For ease of understanding of the overall operation, only some of the reference characters are shown in FIGS. 14–28. As shown in FIG. 14, the wafer transport mechanism starts in position 2 awaiting an unprocessed wafer from the in-air robot (not shown). The in-air robot (i.e., the front end loader for loading wafers), is in the wafer-handling unit outside the loadlock chamber assembly 118. As shown in FIG. 15, with the loadlock chamber at atmospheric pressure and chamber gate 164 in an open position, the upper arm assembly (120, 122 and 124) receives a first unprocessed wafer 290*a* from the in-air robot. The loadlock chamber gate 164 is then closed and pumped to a desired pressure using vacuum apparatus 108, 100. As shown in FIG. 16, once the desired pressure is obtained, the first wafer 290*a* is lowered to position 3 and the slit valve 150 separating the process chamber 104 from the loadlock chamber 118, 116 is opened. As shown in FIG. 17, the upper arm assembly (120, 122,

124) extends into the process chamber 104 with the first wafer 290*a* over the wafer pins 190, 192 and wafer temperature measuring device 193. As shown in FIG. 18, the arm assembly lowers to position 4, dropping the first wafer 290*a* onto the wafer pins 190, 192 and thermocouple 193 (the upper arm end effector 124 is now below the wafer support pins 190, 192 and thermocouple 193). As shown in FIG. 19, the upper arm assembly 120, 122, 124 returns to the loadlock chamber 118. At this point, the slit valve 150 closes allowing the unprocessed wafer 290*a* to begin the selected process in the process chamber 104. Simultaneously, the loadlock chamber assembly 102 is purged back to atmospheric pressure with $N_2$ or the like. As shown in FIG. 20, the arm assembly rises to position 2 in preparation to receive the second unprocessed wafer 290*b* on the upper arm assembly 120, 122, 124 from the in-air robot (gate 164 is opened and the loadlock chamber assembly returns to atmospheric pressure). After a wafer is placed on the upper pan, the loadlock chamber is returned to the wafer transfer pressure of 0.1 to 1.0 torr using vacuum pumping apparatus 108, 110. After the wafer processing has been completed in the process chamber 104, and the loadlock chamber assembly 102 returns to transfer pressure, slit valve 150 opens (see FIG. 4). As shown in FIG. 21, the lower arm assembly 130, 132, 134 extends into the process chamber 104 (and is now below the wafer pins 190, 192 and thermocouple 193). As shown in FIG. 22, the arm assembly rises to position 1 to pick up the first (now processed) wafer 290*a* from the wafer pins 190, 192 and thermocouple 193 (the lower arm end effector 134 is now above the wafer pins 190, 192 and thermocouple 193). As shown in FIG. 23, the lower arm assembly 130, 132, 134 returns to the loadlock chamber assembly 102 with the first wafer 290*a*. As shown in FIG. 24, the arm assembly lowers to position 3, placing the first wafer 290*a* on the cold plate 142 and preparing to extend the upper arm end effector 124 into the process chamber 104 with a second wafer 290*b*. As shown in FIG. 25, the upper arm assembly 120, 122, 124 extends into the process chamber 104 with the second wafer 290*b* (the second wafer 290*b* is above the wafer pins 190, 192 and thermocouple 193). As shown in FIG. 26, the upper arm assembly 120, 122, 124 lowers to position 4, dropping the second wafer 290*b* onto the wafer pins 190, 192 and thermocouple 193 (the upper arm end effector 124 is now below the wafer pins 190, 192 and thermocouple 193). As shown in FIG. 27, the upper arm assembly 120, 122, 124 returns to the loadlock chamber assembly 102. At this point, the slit valve 150 closes isolating the process chamber for wafer processing whereas the loadlock chamber is purged to atmospheric pressure to allow controlled cooling of wafer 290*a* on the cold plate 142. In FIG. 28, the arm assembly rises to position 2, picking up the first wafer 290*a* with the lower arm assembly 130, 132, 134. The in-air robot takes the first wafer 290*a* from the lower arm assembly. The arm assembly mechanism then returns with the upper arm assembly 120, 122, 124 receiving a third wafer 290*c* (not shown) from the in-air robot (as previously shown inn FIG. 21). The process is then repeated for additional wafers in accordance with the process shown in FIGS. 14–28.

It is important to note that, in a preferred embodiment, the link arm assembly is vacuum sealed such that a differential pressure can be continuously maintained between the internal cavity of the link arm and the surrounding loadlock chamber. More preferably, the pressure within the link arm assembly is continuously maintained below the pressure within the loadlock chamber. A vacuum apparatus (not shown) different from the vacuum system may be used to evacuate the loadlock chamber. Preferably, the link arm internal cavity is connected to a foreline portion of a vacuum apparatus connected to and used to maintain a vacuum in the adjacent process chamber. As such, the pressure within the foreline portion is preferably lower than the minimum operating pressure of the loadlock chamber.

Maintaining the differential pressure prevents flow or disbursement of particles generated by the rotary motion of the vacuum seals during movement of the arms within the chamber. The differential pressure across the robot arm rotating seals insures that any dislodged particles caused by the abrading of the seal surfaces are moved by gas flow, or as a function of the differential pressure, to the internal cavity of the crank arm.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A process for transporting substrates between two regions having different pressures without substantially affecting the pressure of either region, the process comprising:

housing a first and second robot arm in a removable sub-chamber coupled to a loadlock chamber, wherein the first and second arms include a primary pivot axis within the sub-chamber;

reducing a pressure in the loadlock chamber to an operating pressure in an adjacent process chamber, wherein a closable port is disposed between the process chamber and the loadlock chamber;

rotating the first robot arm about the primary pivot axis for extending the first robot arm and an attached first end effector into the process chamber to retrieve a first substrate;

moving the first robot arm in the vertical or z-axis direction to lift the first substrate;

rotating the first robot arm about the primary pivot axis to retract the first robot arm and the attached end effector from the process chamber and move the end effector with the first substrate into the loadlock chamber;

rotating a second robot arm about the primary pivot axis for extending the second robot arm and an attached second end effector with a second substrate thereon into the process chamber at an atmospheric pressure;

rotating the second robot arm about the primary pivot axis to retract the attached second end effector from the process chamber into the loadlock chamber, wherein the operating pressure of the process chamber is maintained;

closing the port between the process chamber and the loadlock chamber; and adjusting a pressure within the loadlock chamber to an ambient atmospheric pressure while maintaining the operating pressure within the process chamber.

2. The process according to claim 1, wherein the first and second substrates have a substantially linear translation path between the process chamber and loadlock chamber.

3. The substrate transport method of claim 1, wherein retreiving the first substrate from the process chamber further comprises placing the first substrate onto a temperature-controlled surface within the loadlock chamber.

4. The substrate transport method of claim 1, wherein rotating the first robot arm about the primary pivot axis comprises engaging a cam follower link with a non-rotating cam, wherein the cam follower link is driven by a rocker arm for pivoting a first translating arm coupled to the first robot arm about a secondary pivot axis.

5. The substrate transport method of claim 4, wherein the cam follower link maintains contact with the cam during rotation of the arm by means of a spring coupled to the rocker arm and a housing of the robot arm.

6. The substrate transport method of claim 5, wherein the first cam follower link pivots away from mechanical contact with the cam upon elongating the spring.

7. The substrate transport method of claim 1, wherein the first and second robot arms further include first and second link arms, respectively, wherein the links arm rotate approximately 130 degrees about the primary pivot axis.

8. The substrate transport method of claim 1, wherein the first and second robot arms have a distal end attached to first and second translating arms and intermediate respective first and second end effectors, wherein the first and second translating arms rotate about 57 degrees as the first and second robot arms are rotated 130 degrees about the primary pivot axis.

9. A process for transporting substrates between two regions having different pressures without substantially affecting the pressure of either region, the process comprising:

housing a first and second robot arm in a removable sub-chamber coupled to a loadlock chamber, wherein the first and second arms include a primary pivot axis within the sub-chamber;

processing a first wafer in a process chamber at a predetermined operating pressure, wherein the process chamber is coupled to the loadlock chamber and includes a closable port therebetween;

removing a first substrate from the process chamber with the first robot arm and depositing a second unprocessed substrate into the process chamber with the second robot arm at the operating pressure of the process chamber;

closing the port and processing the second substrate in the process chamber at the operating pressure while simultaneously venting the loadlock chamber, receiving a third substrate from outside the loadlock chamber, and removing the first substrate to a position outside the loadlock chamber and process chamber;

reducing the pressure in the loadlock chamber to the operating pressure of the process chamber; and opening the port and removing the second substrate from the process chamber with the first robot arm and depositing the third substrate into the process chamber with the second robot arm at the operating pressure of the process chamber.

10. The process according to claim 9, wherein rotating the first robot arm about the primary pivot axis comprises engaging a cam follower link with a non-rotating cam, wherein the cam follower link is driven by a rocker arm for pivoting a first translating arm coupled to the first robot arm about a secondary pivot axis.

11. The process according to claim 9, wherein the first and second robot arms rotate 130 degrees about the primary pivot axis.

12. The process according to claim 9, wherein the first, second and third substrates have a substantially linear translation path between the process chamber, loadlock chamber, and the position outside the loadlock chamber and process chamber.

13. The process according to claim 9, wherein the first and second robot arms each comprise a link arm assembly including an elongated housing having a first end and a second end, wherein the link arm assembly comprises a cam disposed within the housing and a four bar link mechanism driven by the cam.

14. The process according to claim 13, wherein the link arm assembly rotates to engage the four bar link mechanism with the cam to pivotably move a translating arm about a secondary pivot axis, wherein the translating arm is attached to the link arm assembly at one end and an end effector at another end.

15. The process according to claim 13, further comprising vacuum sealing the link arm assembly.

16. The process according to claim 13, farther comprising maintaining a pressure within the link arm assembly below the operating pressure of the process chamber.

* * * * *